US011121016B2

(12) United States Patent
Kitamura et al.

(10) Patent No.: US 11,121,016 B2
(45) Date of Patent: Sep. 14, 2021

(54) METHOD FOR CONTROLLING CONVEYANCE SYSTEM, CONVEYANCE SYSTEM, AND MANAGEMENT DEVICE

(71) Applicant: MURATA MACHINERY, LTD., Kyoto (JP)

(72) Inventors: Wataru Kitamura, Inuyama (JP); Tetsuya Kuwahara, Kyoto (JP)

(73) Assignee: MURATA MACHINERY, LTD., Kyoto (JP)

( * ) Notice: Subject to any disclaimer, the term of this patent is extended or adjusted under 35 U.S.C. 154(b) by 0 days.

(21) Appl. No.: 16/960,334

(22) PCT Filed: Dec. 18, 2018

(86) PCT No.: PCT/JP2018/046539
§ 371 (c)(1),
(2) Date: Jul. 7, 2020

(87) PCT Pub. No.: WO2019/138802
PCT Pub. Date: Jul. 18, 2019

(65) Prior Publication Data
US 2021/0057254 A1 Feb. 25, 2021

(30) Foreign Application Priority Data
Jan. 10, 2018 (JP) .............................. JP2018-001760

(51) Int. Cl.
*H01L 21/677* (2006.01)
*H01L 21/67* (2006.01)
*B65G 1/04* (2006.01)

(52) U.S. Cl.
CPC .. *H01L 21/67769* (2013.01); *H01L 21/67276* (2013.01); *B65G 1/04* (2013.01)

(58) Field of Classification Search
CPC ........ H01L 21/67769; H01L 21/67276; B65G 1/04
See application file for complete search history.

(56) References Cited

U.S. PATENT DOCUMENTS 6,646,999 B1    11/2003  Kato et al.
9,758,308 B1 *   9/2017  Nishikawa ........ H01L 21/67733
(Continued)

FOREIGN PATENT DOCUMENTS

JP      3782654 B2     6/2006
JP      4035803 B2     1/2008
JP      2015-082574 A  4/2015

*Primary Examiner* — Glenn F Myers
(74) *Attorney, Agent, or Firm* — Keating & Bennett, LLP

(57) ABSTRACT

A method for controlling a conveyance system includes transmitting, by a specific conveyance vehicle specific transfer location information to a management device, extracting from correspondence information by the management device, specific communication-device address information corresponding to the specific transfer location information received from the specific conveyance vehicle, and transmitting to the specific conveyance vehicle by the management device the specific communication-device address information extracted, and executing by the specific conveyance vehicle using the specific communication-device address information received from the management device communication with a first communication device connected to a first semiconductor manufacturing device to transfer a FOUP between the first semiconductor manufacturing device and the specific conveyance vehicle.

14 Claims, 11 Drawing Sheets

(56) References Cited

U.S. PATENT DOCUMENTS 9,805,961 B2 * 10/2017 Kuroyanagi ....... G05B 19/4189
2013/0138237 A1 * 5/2013 Chen ................. H01L 21/67733
700/113

* cited by examiner

FIG. 3

| Station number of semiconductor manufacturing device | IP address of communication device |
|---|---|
| ST1 | xx.xx.xx.xx |
| ST2 | yy.yy.yy.yy |
| ⋮ | ⋮ | ered by the plurality of conveyance vehicles; a plurality of
METHOD FOR CONTROLLING CONVEYANCE SYSTEM, CONVEYANCE SYSTEM, AND MANAGEMENT DEVICE

BACKGROUND OF THE INVENTION

1. Field of the Invention

The present invention relates to a method for controlling a conveyance system, the conveyance system, and a management device.

2. Description of the Related Art

Japanese Unexamined Patent Application Publication No. 2015-82574 discloses a semiconductor manufacturing system that includes: a plurality of overhead-traveling conveyance vehicles for conveying front opening united pods (FOUPs) each storing semiconductor wafers; and a plurality of semiconductor manufacturing devices for processing the semiconductor wafers.

A pair of communication devices and a wireless access point are disposed at each of the plurality of semiconductor manufacturing devices. Moreover, a load port on which the FOUP is to be placed is disposed at each of the plurality of semiconductor manufacturing devices. Each of the communication devices is connected to the load port via a parallel cable and also to the wireless access point via a local area network (LAN) cable.

Each of the plurality of conveyance vehicles is capable of wirelessly communicating with the communication devices via the wireless access point. When approaching a specific semiconductor manufacturing device, the conveyance vehicle transmits a message signal for starting a process of transferring the FOUP with the load port of this specific semiconductor manufacturing device, to the communication device connected to this load port.

SUMMARY OF THE INVENTION

When transmitting the message signal to the communication device, the conveyance vehicle included in the semiconductor manufacturing system described above needs to specify an address of the communication device as a recipient of the message signal. However, if any semiconductor manufacturing device is added, removed, or changed, for example, the address of the communication device may be changed. Unfortunately, this may result in complicated management of the addresses of the communication devices in each of the plurality of conveyance vehicles.

Preferred embodiments of the of the present invention provide methods for controlling conveyance systems, the conveyance systems, and management devices capable of collective management of communication-device address information.

An aspect of a preferred embodiment of the present invention provides a method for controlling a conveyance system including a plurality of conveyance vehicles that convey conveyance subjects; a plurality of transfer devices to and from which the conveyance subjects are transferred by the plurality of conveyance vehicles; a plurality of communication devices each of which is connected to a corresponding one of the plurality of transfer devices; and a management device that manages the plurality of communication devices, each of the plurality of conveyance vehicles including a first storage that stores specific transfer location information indicating a transfer location of a conveyance subject in a specific transfer device among the plurality of transfer devices, the management device including a second storage that stores correspondence information indicating a correspondence between transfer location information indicating a transfer location of the conveyance subject for each one of the plurality of transfer devices and communication-device address information indicating an address of a corresponding one of the plurality of communication devices that is connected to the one of the plurality of transfer devices, the method including: (a) transmitting, by a specific conveyance vehicle among the plurality of conveyance vehicles, the specific transfer location information to the management device; (b) extracting, from the correspondence information by the management device, specific communication-device address information corresponding to the specific transfer location information received from the specific conveyance vehicle, and transmitting, to the specific conveyance vehicle by the management device, the specific communication-device address information extracted; and (c) executing, by the specific conveyance vehicle, communication with a specific communication device among the plurality of communication devices that is connected to the specific transfer device, using the specific communication-device address information received from the management device, the communication being executed to transfer the conveyance subject between the specific transfer device and the specific conveyance vehicle.

According to this aspect, the management device stores the correspondence information indicating the correspondence between the transfer location information and the communication-device address information. This enables the management device to collectively manage the communication-device address information. Hence, even if the communication-device address information of the communication device is changed due to addition, removal, or change of any transfer device, for example, the correspondence information stored in the management device is able to be easily updated with a small workload.

For example, it is possible that the conveyance system further includes a controller that controls traveling of the plurality of conveyance vehicles, the method further includes (d) receiving, by the specific conveyance vehicle from the controller, management-device address information indicating an address of the management device, and in step (a), the specific conveyance vehicle transmits the specific transfer location information to the management device using the management-device address information received from the controller.

According to this aspect, the specific conveyance vehicle does not need to store the management-device address information beforehand. This saves storage capacity of the first storage.

For example, it is also possible that the management device in the conveyance system includes a plurality of management devices including a first management device and a second management device, in step (d), the specific conveyance vehicle receives, from the controller, a plurality of management-device address information pieces each indicating an address of a corresponding one of the management devices, and in step (a), the specific conveyance vehicle selects first management-device address information indicating an address of the first management device from among the plurality of management-device address information pieces received from the control device and transmits the specific transfer location information to the first management device using the first management-device address information.

According to this aspect, the plurality of management devices included in the conveyance system are able to achieve redundancy.

For example, it is further possible that the method further includes (e) selecting, by the specific conveyance vehicle, second management-device address information indicating an address of the second management device from among the plurality of management-device address information pieces received from the controller and transmitting, by the specific conveyance vehicle, the specific transfer location information to the second management device using the second management-device address information, if communication with the first management device is unavailable in step (a).

According to this aspect, even if communication with the first management device is unavailable, the specific conveyance vehicle is able to transmit the specific transfer location information to the second management device using the second management-device address information.

For example, it is still further possible that the management device in the conveyance system includes a plurality of management devices including a first management device and a second management device, in step (d), the specific conveyance vehicle receives, from the controller, first management-device address information indicating an address of the first management device, in step (a), the specific conveyance vehicle transmits the specific transfer location information to the first management device using the first management-device address information received from the control device, and the method further includes: (f) receiving, by the specific conveyance vehicle from the controller, second management-device address information indicating an address of the second management device, if communication with the first management device is unavailable in step (a); and (g) transmitting, to the second management device by the specific conveyance vehicle, the specific transfer location information using the second management-device address information received from the controller.

According to this aspect, the plurality of management devices included in the conveyance system are able to achieve redundancy. Moreover, even if communication with the first management device is unavailable, the specific conveyance vehicle can transmit the specific transfer location information to the second management device using the second management-device address information. Furthermore, even if the specific conveyance vehicle can communicate with the first management device in step (a) and thus the first management device extracts, from the correspondence information stored in the first management device, the specific communication-device address information corresponding to the specific transfer location information received from the specific conveyance vehicle, this extraction process may take a relatively long time due to, for example, concentration of communication processing. In such a case, the first management device transmits a response signal indicating this to the specific conveyance vehicle. When receiving this response signal from the first management device, the specific conveyance vehicle may transmit the specific transfer location information to the second management device using the second management-device address information among the plurality of management-device address information pieces received from the controller.

For example, it is still further possible that the method further includes: (h) transmitting, by the controller, a first traveling instruction signal for instructing a first conveyance vehicle among the plurality of conveyance vehicles to travel to a position of the specific transfer device and transfer a first conveyance subject from the first conveyance vehicle to the specific transfer device; (i) obtaining, by the management device, conveyance-subject information indicating whether a second conveyance subject is present above the specific transfer device; (j) determining, by the first conveyance vehicle after receiving the first traveling instruction signal, a first traveling plan indicating a first route by which the first conveyance vehicle travels from a current position to the position of the specific transfer device; (k) making an inquiry of the management device about whether the second conveyance subject is to be present above the specific transfer device at a first time, assuming that the first conveyance vehicle is to arrive at the position of the specific transfer device at the first time by following the first traveling plan; and (l) (1) adopting, by the first conveyance vehicle, the first traveling plan if a result indicating that the second conveyance subject is not present above the specific transfer device is received from the management device in response to the inquiry, and (2) determining, by the first conveyance vehicle, a second traveling plan different from the first traveling plan and adopting the determined second traveling plan if a result indicating that the second conveyance subject is present above the specific transfer device is received from the management device in response to the inquiry, wherein the second traveling plan indicates a second route that is longer than the first route and that is followed by the first conveyance vehicle to reach the position of the specific transfer device after transfer of the second conveyance subject from the specific transfer device to a second conveyance vehicle among the plurality of conveyance vehicles has completed and the second conveyance subject has left the position above the specific transfer device.

According to this aspect, the first conveyance vehicle adopts either the first traveling plan or the second traveling plan, depending on whether the second conveyance subject is present above the specific transfer device. This increases efficiency of conveying the first and second conveyance subjects.

For example, it is still further possible that the method further includes: (m) transmitting, by the control device, a third traveling instruction signal for instructing a third conveyance vehicle among the plurality of conveyance vehicles to travel to a position of the specific transfer device and transfer a third conveyance subject from the specific transfer device to the third conveyance vehicle; (n) obtaining, by the management device, conveyance-subject information indicating whether the third conveyance subject is present above the specific transfer device; (o) determining, by the third conveyance vehicle after receiving the third traveling instruction signal, a third traveling plan indicating a third route by which the third conveyance vehicle travels from a current position to the position of the specific transfer device; (p) making an inquiry of the management device about whether the third conveyance subject is to be present above the specific transfer device at a second time, assuming that the third conveyance vehicle is to arrive at the position of the specific transfer device at the second time by following the third traveling plan; and (q) (1) adopting, by the third conveyance vehicle, the third traveling plan if a result indicating that the third conveyance subject is present above the specific transfer device is received from the management device in response to the inquiry, and (2) determining, by the third conveyance vehicle, a fourth traveling plan different from the third traveling plan and adopting the determined fourth traveling plan if a result indicating that the third conveyance subject is not present above the specific transfer device is received from the management device in response to the inquiry, wherein the fourth traveling plan indicates a fourth route that is longer than the third route and that is followed by the third conveyance vehicle to reach the position of the specific transfer device after transfer of the third conveyance subject to the specific transfer device has completed.

According to this aspect, the third conveyance vehicle adopts either the third traveling plan or the fourth traveling plan, depending on whether the third conveyance subject is present above the specific transfer device. This increases the efficiency of conveying the third conveyance subject.

For example, it is still further possible that the method further includes (r) transmitting, by the control device, a second traveling instruction signal, while the second conveyance subject is placed on the specific transfer device, for instructing the second conveyance vehicle to travel to the position of the specific transfer device and transfer the second conveyance subject from the specific transfer device to the second conveyance vehicle.

According to this aspect, the second conveyance vehicle can be instructed to travel to the position of the specific transfer device and transfer the second conveyance subject from the specific transfer device to the second conveyance vehicle.

For example, it is still further possible that the conveyance system further includes a wireless access point, in step (a), the specific conveyance vehicle transmits the specific transfer location information to the management device via the wireless access point, in step (b), the management device transmits the specific communication-device address information to the specific conveyance vehicle via the wireless access point, and in step (c), the specific conveyance vehicle executes the communication with the specific communication device via the wireless access point.

According to this aspect, the specific conveyance vehicle executes wireless communication using the wireless access point. Thus, unlike the case of using optical communication by which optical axes of a transmitter device and a receiver device have to coincide with each other, for example, the specific conveyance vehicle does not need to wait for the start of communication until the optical axes coincide with each other. Thus, the specific conveyance vehicle is able to communicate with each of the management device and the specific communication device while moving. This results in a reduction in time taken for the specific conveyance vehicle to complete the communication with the specific communication device.

For example, it is still further possible that the method further includes (s) if no response is received from the specific communication device when the specific conveyance vehicle attempts to establish the communication with the specific communication device via the wireless access point in step (c), determining by the specific conveyance vehicle that the specific communication device is incapable of communication and notifying the management device by the specific conveyance vehicle about a result of the determining via the wireless access point.

According to this aspect, the management device is able to easily determine whether the communication devices are capable of communication.

For example, it is still further possible that the method further includes: (t) transmitting, by the management device, a heartbeat signal to each of the plurality of communication devices; and (u) if the management device receives a response to the heartbeat signal from a communication device among the plurality of communication devices, determining by the management device that the communication device is capable of communication, and if the management device receives no response to the heartbeat signal from a communication device among the plurality of communication devices, determining by the management device that the communication device is incapable of communication.

According to this aspect, the management device is able to easily determine whether the communication devices are capable of communication.

For example, it is still further possible that the correspondence information further includes communication attribute information indicating a communication attribute of the corresponding one of the plurality of communication devices in association with the transfer location information and the management-device address information, in step (b), the management device extracts, from the correspondence information, the specific communication-device address information and specific communication attribute information corresponding to the specific transfer location information received from the specific conveyance vehicle and transmits, to the specific conveyance vehicle, the specific communication-device address information extracted and the specific communication attribute information extracted, and in step (c), the specific conveyance vehicle executes the communication with the specific communication device using the specific communication-device address information and the specific communication attribute information received from the management device.

According to this aspect, the specific conveyance vehicle is able to execute communication, with the specific communication device, corresponding to the communication attribute information of the specific communication device.

In accordance with another aspect of a preferred embodiment of the present invention, a conveyance system conveys conveyance subjects and includes: a plurality of conveyance vehicles that convey conveyance subjects; a plurality of transfer devices to and from which the conveyance subjects are transferred by the plurality of conveyance vehicles; a plurality of communication devices each of which is connected to a corresponding one of the plurality of transfer devices; and a management device that manages the plurality of communication devices, wherein each of the plurality of conveyance vehicles includes: a first storage that stores specific transfer location information indicating a transfer location of a conveyance subject in a specific transfer device among the plurality of transfer devices; and a first communicator that transmits the specific transfer location information to the management device, the management device includes: a second storage that stores correspondence information indicating a correspondence between transfer location information indicating a transfer location of the conveyance subject for each one of the plurality of transfer devices and communication-device address information indicating an address of a corresponding one of the plurality of communication devices that is connected to the one of the plurality of transfer devices; a controller that extracts, from the correspondence information, specific communication-device address information corresponding to the specific transfer location information received from a specific conveyance vehicle among the plurality of conveyance vehicles; and a second communicator that transmits, to the specific conveyance vehicle, the specific communication-device address information extracted, and the first communicator of the specific conveyance vehicle executes communication with a specific communication device among the plurality of communication devices that is connected to the specific transfer device, using the specific communication-device address information received from the management device, the communication being executed to transfer the conveyance subject between the specific transfer device and the specific conveyance vehicle.

According to this aspect, the management device stores the correspondence information indicating the correspondence between the transfer location information and the communication-device address information. This enables the management device to collectively manage the communication-device address information. Hence, even if the communication-device address information of the communication device is changed due to addition, removal, or change of any transfer device, for example, the correspondence information stored in the management device can be easily updated with a small workload.

In accordance with still another aspect of a preferred embodiment of the present invention, a management device manages a plurality of communication devices each of which is connected to a corresponding one of a plurality of transfer devices to and from which a conveyance subject is transferred by a conveyance vehicle, the management device including: a storage that stores correspondence information indicating a correspondence between transfer location information indicating a transfer location of the conveyance subject for each one of the plurality of transfer devices and communication-device address information indicating an address of a corresponding one of the plurality of communication devices that is connected to the one of the plurality of transfer devices; a communicator that receives, from the conveyance vehicle, specific transfer location information indicating a transfer location of the conveyance subject in a specific transfer device among the plurality of transfer devices; and a controller that extracts, from the correspondence information, specific communication-device address information corresponding to the specific transfer location information received, wherein the communicator transmits, to the conveyance vehicle, the specific communication-device address information extracted.

According to this aspect, the management device stores the correspondence information indicating the correspondence between the transfer location information and the communication-device address information. This enables the management device to collectively manage the communication-device address information. Hence, even if the communication-device address information of the communication device is changed due to addition, removal, or change of any transfer device, for example, the correspondence information stored in the management device can be easily updated with a small workload.

A method for controlling a conveyance system and so forth in an aspect according to a preferred embodiment of the present invention enables the collective management of the communication-device address information.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3 illustrates an example of a management table according to Preferred Embodiment 1 of the present invention.

DETAILED DESCRIPTION OF THE PREFERRED EMBODIMENTS

Hereinafter, certain preferred embodiments will be described in detail with reference to the accompanying Drawings. The following preferred embodiments are general or specific examples of the present invention. The numerical values, shapes, materials, elements, arrangement and connection configuration of the elements, steps, the order of the steps, etc., described in the following preferred embodiments are merely examples, and are not intended to limit the present invention. Among elements in the following preferred embodiments, those not described in any one of the independent claims indicating the broadest concept of the present invention are described as optional elements.

Preferred Embodiment

[1-1. Overview of Conveyance System]

Figure 1:
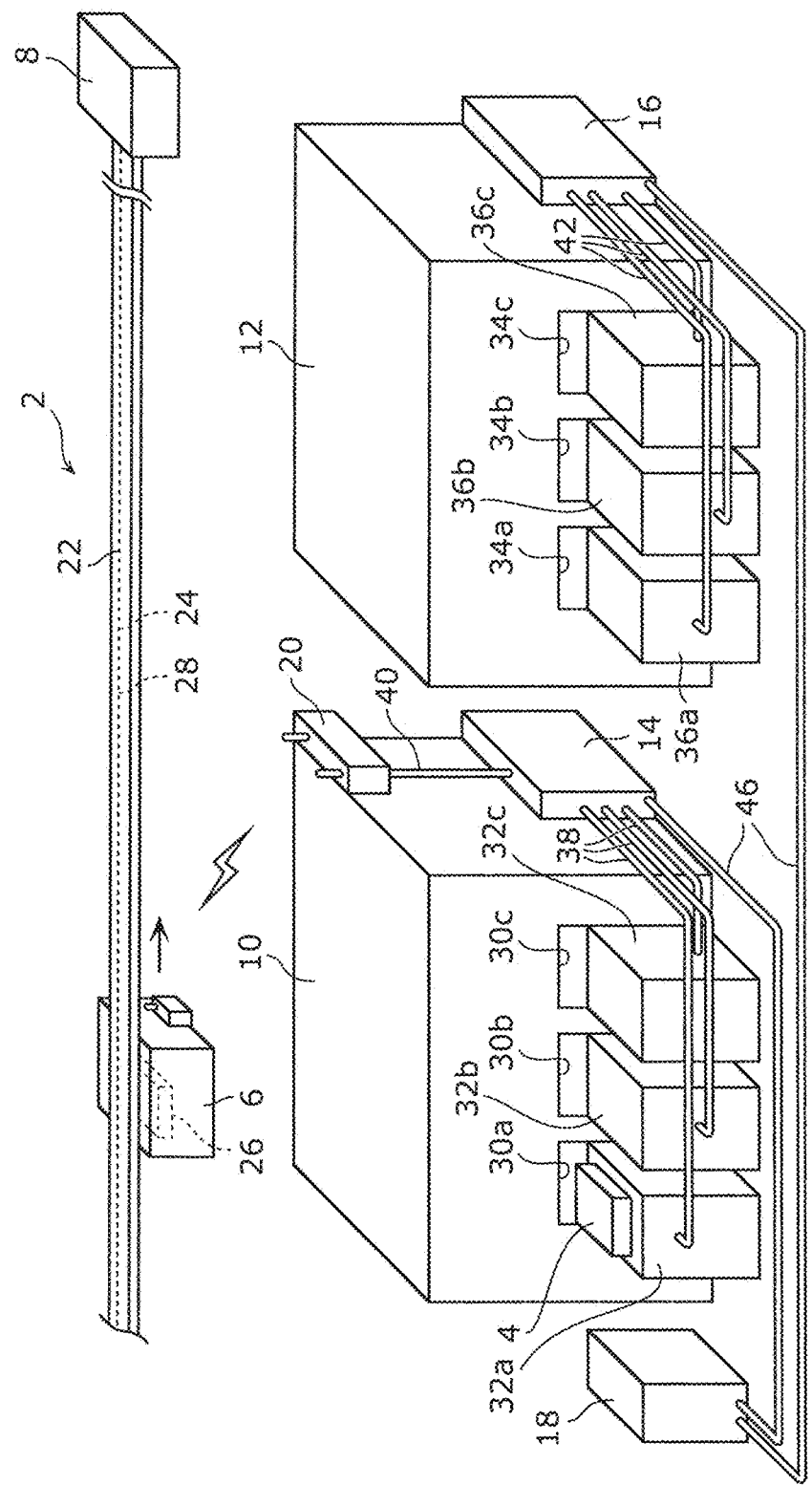
FIG. 1 is an overview diagram illustrating a conveyance system according to Preferred Embodiment 1 of the present invention.

An overview of a conveyance system 2 according to Preferred Embodiment 1 is first described, with reference to FIG. 1. FIG. 1 is an overview diagram illustrating the conveyance system 2 according to Preferred Embodiment 1.

As illustrated in FIG. 1, the conveyance system 2 is used in, for example, a semiconductor manufacturing plant and conveys FOUPs 4 (an example of conveyance subjects) storing wafers. The conveyance system 2 includes a plurality of conveyance vehicles 6, a controller 8, a first semiconductor manufacturing device 10 (an example of a transfer device), a second semiconductor manufacturing device 12 (an example of a transfer device), a first communication device 14, a second communication device 16, a management device 18, and a wireless access point 20.

Each of the plurality of conveyance vehicles 6 is a so-called overhead hoist transfer (OHT) that is an overhead-traveling conveyance vehicle for conveying the FOUP 4 by traveling, without humans in attendance, along a rail 22 mounted on a ceiling of the semiconductor manufacturing plant, for example. The conveyance vehicle 6 is capable of contactlessly receiving power supplied from a power supply module (not illustrated) via a power feed path 24 installed along the rail 22, through an electromagnetic induction phenomenon. This enables the conveyance vehicle 6 to travel along the rail 22 while receiving the power from the power feed path 24.

The conveyance vehicle 6 includes a holder 26, which is used for holding the FOUP 4 and mounted to be vertically movable. For example, when the FOUP 4 is to be transferred between the conveyance vehicle 6 and a load port 32a (described later) of the first semiconductor manufacturing device 10, the holder 26 moves down from the conveyance vehicle 6 to approach the load port 32a. Then, after the completion of the transfer of the FOUP 4, the holder 26 moves away from the load port 32a to go up to the conveyance vehicle 6 and then is housed into the conveyance vehicle 6. Here, the semiconductor manufacturing plant includes the plurality of (for example, 3000) conveyance vehicles 6. However, only one conveyance vehicle 6 is illustrated in the drawings including FIG. 1 for convenience of description.

The controller 8 is a so-called overhead hoist vehicle controller (OHVC), which is a computer that controls a traveling operation for each of the plurality of conveyance vehicles 6. The controller 8 is capable of communicating with each of the plurality of conveyance vehicles 6 via a feeder line 28 installed along the rail 22.

Each of the first semiconductor manufacturing device 10 and the second semiconductor manufacturing device 12 is a station that, for example, processes or temporarily accommodates wafers stored in the FOUP 4. Each of the first semiconductor manufacturing device 10 and the second semiconductor manufacturing device 12 is located directly below the rail 22.

The first semiconductor manufacturing device 10 includes: a plurality of (for example, three) conveyance openings 30a, 30b, and 30c each used for carrying in and out a FOUP 4; and a plurality of (for example, three) load ports 32a, 32b, and 32c on each of which the FOUP 4 is to be placed. Each of the plurality of load ports 32a, 32b, and 32c is located near a corresponding one of the plurality of conveyance openings 30a, 30b, and 30c. Each of the plurality of load ports 32a, 32b, and 32c is used for transferring the FOUP 4 to and from the holder 26 of the conveyance vehicle 6 and passes the FOUP 4 to and from the first semiconductor manufacturing device 10 via the corresponding one of the plurality of conveyance openings 30a, 30b, and 30c. Although the first semiconductor manufacturing device 10 includes the three load ports 32a, 32b, and 32c according to the present preferred embodiment, this is not intended to be limiting. The first semiconductor manufacturing device 10 may include one, two, or four or more load ports, for example.

The second semiconductor manufacturing device 12 includes: a plurality of (for example, three) conveyance openings 34a, 34b, and 34c each used for carrying in and out a FOUP 4; and a plurality of (for example, three) load ports 36a, 36b, and 36c on each of which the FOUP 4 is to be placed. Each of the plurality of load ports 36a, 36b, and 36c is located near a corresponding one of the plurality of conveyance openings 34a, 34b, and 34c. Each of the plurality of load ports 36a, 36b, and 36c is used for transferring the FOUP 4 to and from the holder 26 of the conveyance vehicle 6 and passes the FOUP 4 to and from the second semiconductor manufacturing device 12 via the corresponding one of the plurality of conveyance openings 34a, 34b, and 34c. Although the second semiconductor manufacturing device 12 includes the three load ports 36a, 36b, and 36c according to the present preferred embodiment, this is not intended to be limiting. The second semiconductor manufacturing device 12 may include one, two, or four or more load ports, for example.

Here, the semiconductor manufacturing plant includes the plurality of (for example, 10000) semiconductor manufacturing devices. However, only two semiconductor manufacturing devices (the first semiconductor manufacturing device 10 and the second semiconductor manufacturing device 12) are illustrated in the drawings including FIG. 1 for convenience of description.

The first communication device 14 is a device server that establishes communication between each of the plurality of load ports 32a, 32b, and 32c of the first semiconductor manufacturing device 10 and the conveyance vehicle 6. The first communication device 14 includes a plurality of parallel ports, each of which is connected to a corresponding one of the plurality of load ports 32a, 32b, and 32c of the first semiconductor manufacturing device 10 via a parallel cable 38. This allows the first communication device 14 to communicate with the plurality of load ports 32a, 32b, and 32c of the first semiconductor manufacturing device 10. Moreover, the first communication device 14 is connected to the wireless access point 20 via a LAN cable 40. This allows the first communication device 14 to establish Ethernet (registered trademark) communication with each of the plurality of conveyance vehicles 6 via the wireless access point 20. Note that a Semiconductor Equipment and Materials International (SEMI) E84 communication sequence, for example, is applied to the communication between the first communication device 14 and each of the plurality of conveyance vehicles 6.

The second communication device 16 is a device server that establishes communication between each of the plurality of load ports 36a, 36b, and 36c of the second semiconductor manufacturing device 12 and the conveyance vehicle 6. The second communication device 16 includes a plurality of parallel ports, each of which is connected to a corresponding one of the plurality of load ports 36a, 36b, and 36c of the second semiconductor manufacturing device 12 via a parallel cable 42. This allows the second communication device 16 to communicate with the plurality of load ports 36a, 36b, and 36c of the second semiconductor manufacturing device 12. Moreover, the second communication device 16 is connected to the wireless access point 20 via a LAN cable (not illustrated). This allows the second communication device 16 to establish Ethernet (registered trademark) communication with each of the plurality of conveyance vehicles 6 via the wireless access point 20. Note that the SEMI E84 communication sequence, for example, is applied to the communication between the second communication device 16 and each of the plurality of conveyance vehicles 6.

Here, the semiconductor manufacturing plant includes a plurality of communication devices, a total number of which is equal to a total number (10000, for example) of the plurality of semiconductor manufacturing devices. However, only two communication devices (the first communication device 14 and the second communication device 16) are illustrated in the drawings including FIG. 1 for convenience of description.

The management device 18 is a device server manager that manages the plurality of communication devices including the first communication device 14 and the second communication device 16. The management device 18 is connected to each of the first communication device 14 and the second communication device 16 via a LAN cable 46. This allows the management device 18 to communicate with each of the first communication device 14 and the second communication device 16.

The wireless access point 20 is a wireless LAN access point. The wireless access point 20 establishes communication between: (a) each of the plurality of conveyance vehicles 6 and the first communication device 14; (b) each of the plurality of conveyance vehicles 6 and the second communication device 16; and (c) each of the plurality of conveyance vehicles 6 and the management device 18.

[1-2. Functional Configuration of Conveyance System]

Figure 2:
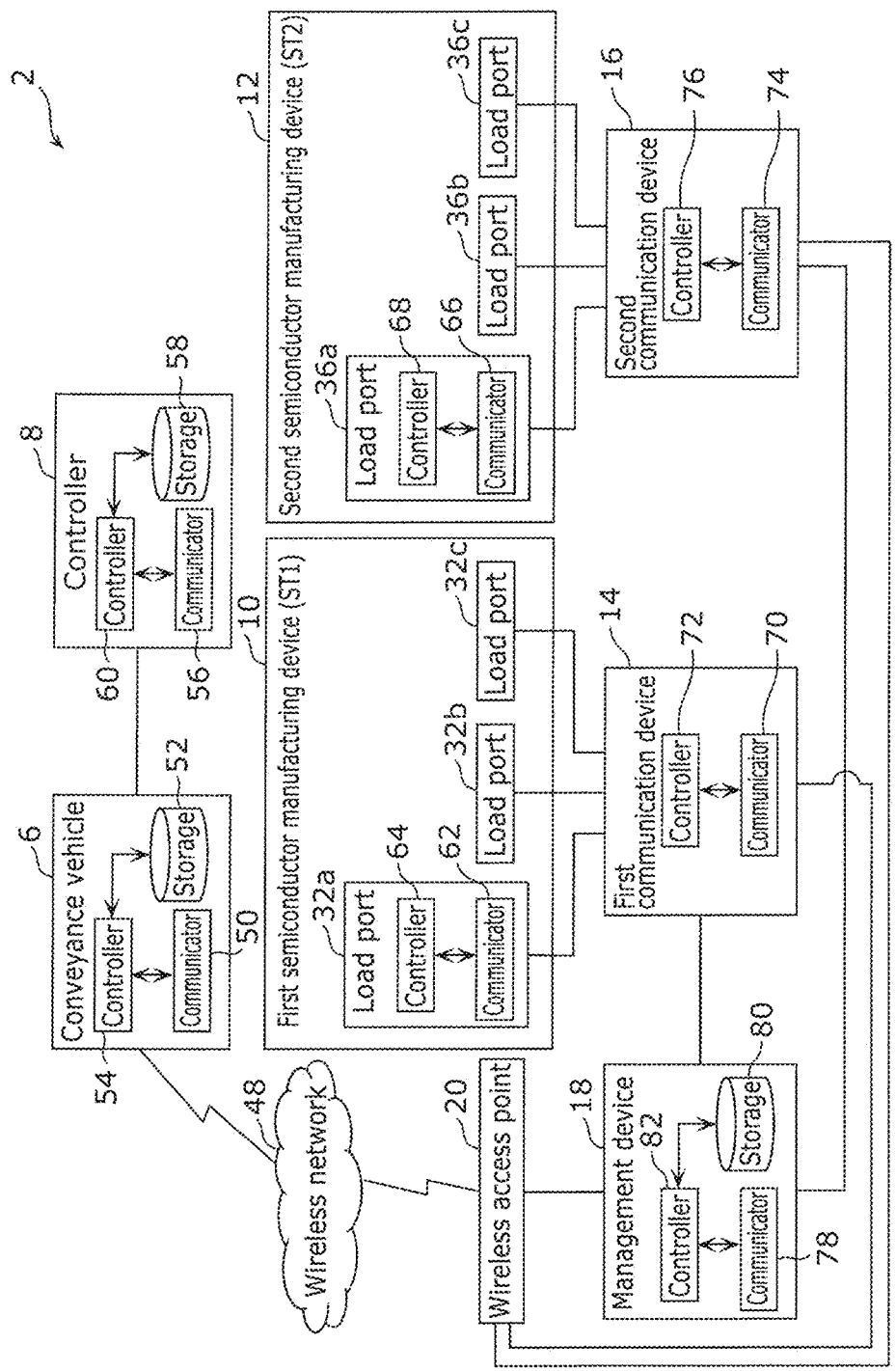
FIG. 2 is a block diagram illustrating a functional configuration of the conveyance system according to Preferred Embodiment 1 of the present invention.

Next, a functional configuration of the conveyance system 2 according to Preferred Embodiment 1 is described with reference to FIG. 2 and FIG. 3. FIG. 2 is a block diagram illustrating the functional configuration of the conveyance system 2 according to Preferred Embodiment 1. FIG. 3 illustrates an example of a management table according to Preferred Embodiment 1.

As illustrated in FIG. 2, each of the plurality of conveyance vehicles 6 and the wireless access point 20 are connected to a wireless network 48 based on, for example, the IEEE 802.11 family of standards. The wireless network 48 is created using a Wi-Fi (registered trademark) 2.4 GHz band or a Wi-Fi 5 GHz band, for example. Each of the first communication device 14, the second communication device 16, and the management device 18 is connected to a wired network created using a wired LAN that includes a cable, for example.

Each of the plurality of conveyance vehicles 6 includes a communicator 50 (an example of a first communicator), a storage 52 (an example of a first storage), and a controller 54.

The communicator 50 communicates wirelessly with the controller 8, the first communication device 14, the second communication device 16, and the management device 18.

The storage 52 is a memory that stores various kinds of data. To be more specific, the storage 52 temporarily stores (a) traveling instruction data included in a traveling instruction signal (described later) received from the controller 8, (b) an internet protocol (IP) address of the management device 18 (an example of management-device address information) received from the controller 8, (c) an IP address of the first communication device 14 (an example of communication-device address information) received from the management device 18, and (d) an IP address of the second communication device 16 (an example of the communication-device address information) received from the management device 18. Here, the storage 52 may previously store the aforementioned data as fixed data sets. Instead of the IP addresses of the first communication device 14 and the second communication device 16, media access control (MAC) addresses may be used, for example. Any information that uniquely identifies each of the first communication device 14 and the second communication device 16 may be used as the communication-device address information.

The controller 54 controls the communicator 50 and the storage 52 to execute various processes. For example, the controller 54 is implemented by a processor reading and executing a software program recorded on a recording medium, such as a hard disk or a semiconductor memory. Specific processes executed by the controller 54 are described in detail later.

The controller 8 includes a communicator 56, a storage 58, and a controller 60.

The communicator 56 communicates wirelessly with each of the plurality of conveyance vehicles 6.

The storage 58 is a memory that stores various kinds of data. To be more specific, the storage 58 stores (a) a station number of the first semiconductor manufacturing device 10, (b) a load port number for each of the plurality of load ports 32a, 32b, and 32c of the first semiconductor manufacturing device 10, (c) a station number of the second semiconductor manufacturing device 12, (d) a load port number for each of the plurality of load ports 36a, 36b, and 36c of the second semiconductor manufacturing device 12, and (e) the IP address of the management device 18.

The station numbers are information used for identifying the first semiconductor manufacturing device 10 and the second semiconductor manufacturing device 12. More specifically, each of the station numbers is an example of transfer location information indicating a transfer location of the FOUP 4. For example, station numbers "ST1" and "ST2" are assigned to the first semiconductor manufacturing device 10 and the second semiconductor manufacturing device 12, respectively.

The load port numbers are information used for identifying the plurality of load ports 32a, 32b, and 32c of the first semiconductor manufacturing device 10 and the plurality of load ports 36a, 36b, and 36c of the second semiconductor manufacturing device 12. More specifically, each of the load port numbers is an example of transfer location information indicating a transfer location of the FOUP 4. For example, load port numbers "LP1", "LP2", and "LP3" are assigned to the plurality of load ports 32a, 32b, and 32c of the first semiconductor manufacturing device 10. Similarly, load port numbers "LP1", "LP2", and "LP3" are assigned to the plurality of load ports 36a, 36b, and 36c of the second semiconductor manufacturing device 12. If each of the first semiconductor manufacturing device 10 and the second semiconductor manufacturing device 12 includes only one load port, no load port number may be used.

The controller 60 controls the communicator 56 and the storage 58 to execute various processes. For example, the controller 60 is implemented by a processor reading and executing a software program recorded on a recording medium, such as a hard disk or a semiconductor memory. Specific processes executed by the controller 60 are described in detail later.

The load port 32a of the first semiconductor manufacturing device 10 includes a communicator 62 and a controller 64. Although not illustrated, each of the other load ports 32b and 32c similarly includes the communicator and the controller.

The communicator 62 performs wired communication with the first communication device 14.

The controller 64 controls the communicator 62 to execute various processes. To be more specific, the controller 64 executes an interlock process to transfer the FOUP 4 to and from the conveyance vehicle 6. The interlock process refers to an interlock sequence of a plurality of operations. With this sequence, one operation is prevented from being executed unless the preceding operation has completed. For example, the controller 64 is implemented by a processor reading and executing a software program recorded on a recording medium, such as a hard disk or a semiconductor memory.

The load port 36a of the second semiconductor manufacturing device 12 includes a communicator 66 and a controller 68. Although not illustrated, each of the other load ports 36*b* and 36*c* similarly includes the communicator and the controller.

The communicator 66 performs wired communication with the second communication device 16.

The controller 68 controls the communicator 66 to execute various processes. To be more specific, the controller 68 executes the interlock process to transfer the FOUP 4 to and from the conveyance vehicle 6. For example, the controller 68 is implemented by a processor reading and executing a software program recorded on a recording medium, such as a hard disk or a semiconductor memory.

The first communication device 14 includes a communicator 70 and a controller 72.

The communicator 70 performs wireless communication with each of the plurality of conveyance vehicles 6 via the wireless access point 20. Moreover, the communicator 70 performs wired communication with the management device 18 and also with each of the plurality of load ports 32*a*, 32*b*, and 32*c* of the first semiconductor manufacturing device 10.

The controller 72 controls the communicator 70 to execute various processes. For example, the controller 72 is implemented by a processor reading and executing a software program recorded on a recording medium, such as a hard disk or a semiconductor memory. Specific processes executed by the controller 72 are described in detail later.

The second communication device 16 includes a communicator 74 and a controller 76.

The communicator 74 performs wireless communication with each of the plurality of conveyance vehicles 6 via the wireless access point 20. Moreover, the communicator 74 performs wired communication with the management device 18 and also with each of the plurality of load ports 36*a*, 36*b*, and 36*c* of the second semiconductor manufacturing device 12.

The controller 76 controls the communicator 74 to execute various processes. For example, the controller 76 is implemented by a processor reading and executing a software program recorded on a recording medium, such as a hard disk or a semiconductor memory.

The management device 18 includes a communicator (an example of a second communicator), a storage 80 (an example of a second storage), and a controller 82.

The communicator 78 performs wireless communication with each of the plurality of conveyance vehicles 6 via the wireless access point 20. Moreover, the communicator 78 performs wired communication with each of the first communication device 14 and the second communication device 16. Here, the communicator 78 may perform wireless communication with each of the first communication device 14 and the second communication device 16 via the wireless access point 20.

The storage 80 is a memory that stores a management table (an example of correspondence information). As illustrated in FIG. 3, the management table is a data table indicating a correspondence between the station numbers of the first semiconductor manufacturing device 10 and the IP addresses of the first communication device 14 and a correspondence between the station numbers of the second semiconductor manufacturing device 12 and the IP addresses of the second communication device 16.

A first row of the management table illustrated as an example in FIG. 3 stores the station number "ST1" of the first semiconductor manufacturing device 10 in association with the IP address "xx.xx.xx.xx" of the first communication device 14 connected to the first semiconductor manufacturing device 10. Similarly, a second row of the management table stores the station number "ST2" of the second semiconductor manufacturing device 12 in association with the IP address "yy.yy.yy.yy" of the second communication device 16 connected to the second semiconductor manufacturing device 12.

The controller 82 controls the communicator 78 and the storage 80 to execute various processes. For example, the controller 82 is implemented by a processor reading and executing a software program recorded on a recording medium, such as a hard disk or a semiconductor memory. Specific processes executed by the controller 82 are described in detail later.

[1-3. Operation Performed by Conveyance System]

Figure 4:
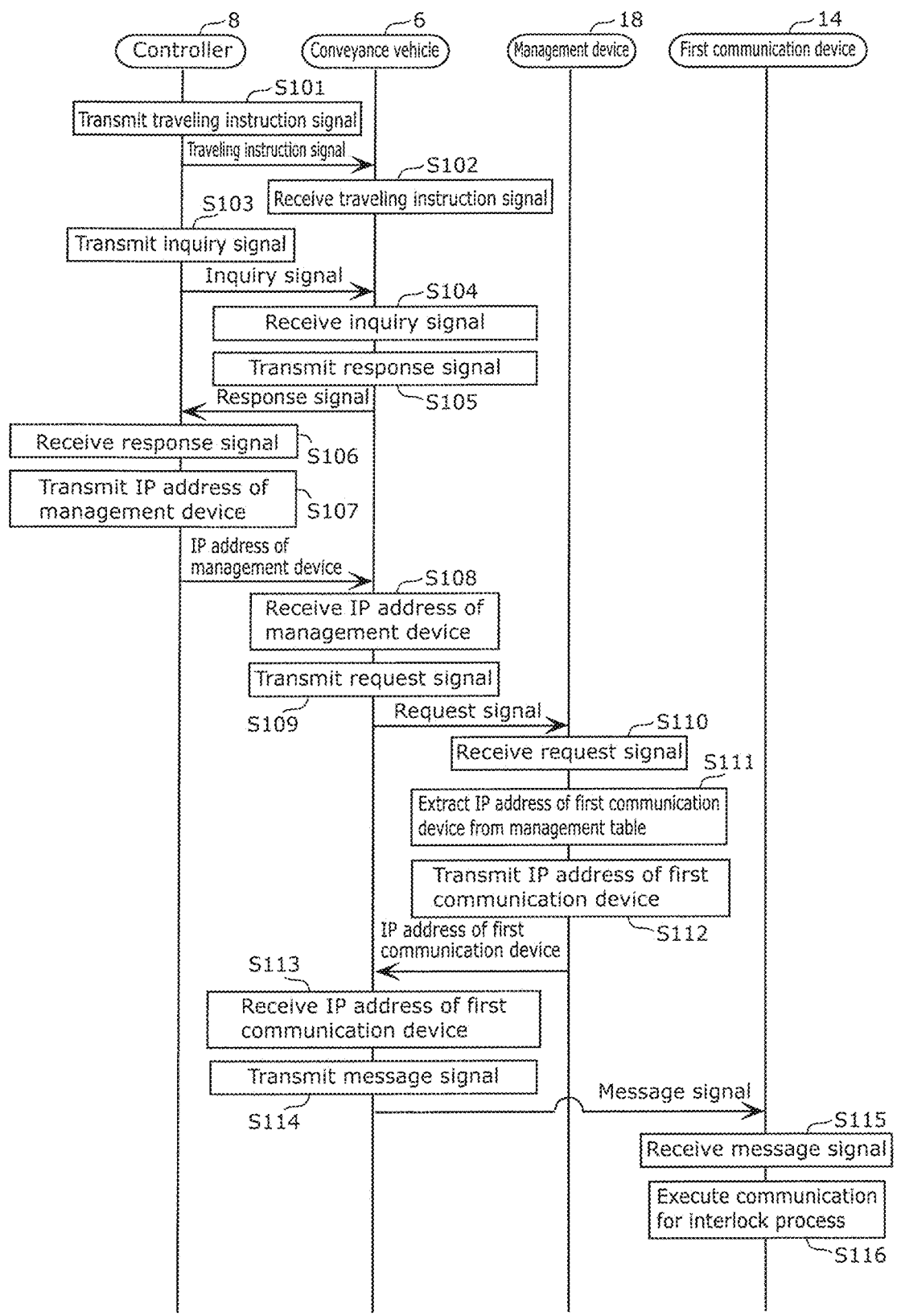
FIG. 4 is a sequence diagram illustrating an operation performed by the conveyance system according to Preferred Embodiment 1 of the present invention.

Next, an operation performed by the conveyance system 2 according to Preferred Embodiment 1 is described with reference to FIG. 4. FIG. 4 is a sequence diagram illustrating the operation performed by the conveyance system 2 according to Preferred Embodiment 1.

The following describes, as an example, the operation performed by the conveyance system 2 when the conveyance vehicle 6 transfers the FOUP 4 to and from the load port 32*a* of the first semiconductor manufacturing device 10.

As illustrated in FIG. 4, the communicator 56 of the controller 8 transmits a traveling instruction signal generated by the controller 60 to the conveyance vehicle 6 (S101). The traveling instruction signal refers to a command for instructing a specific one of the plurality of conveyance vehicles 6 to travel to a predetermined destination. For example, if the destination is the load port 32*a* of the first semiconductor manufacturing device 10, the traveling instruction signal includes, as traveling instruction data indicating the destination of the conveyance vehicle 6, the station number "ST1" of the first semiconductor manufacturing device 10 and the load port number "LP1" of the load port 32*a*. The controller 60 generates the traveling instruction signal by reading the station number "ST1" and the load port number "LP1" from the storage 58.

The communicator 50 of the conveyance vehicle 6 receives the traveling instruction signal transmitted from the controller 8 (S102). The traveling instruction data (such as the station number "ST1" and the load port number "LP1") included in the traveling instruction signal is stored into the storage 52. Then, the controller 54 causes the conveyance vehicle 6 to travel to the destination, which is the load port 32*a* of the first semiconductor manufacturing device 10.

The communicator 56 of the controller 8 periodically transmits an inquiry signal generated by the controller 60 to the conveyance vehicle 6 (S103). The inquiry signal refers to a command for inquiring of the conveyance vehicle 6 about a current travel location.

The communicator 50 of the conveyance vehicle 6 receives the inquiry signal transmitted from the controller 8 (S104). Then, the communicator 50 of the conveyance vehicle 6 transmits a response signal generated by the controller 54 to the controller 8 (S105). The response signal indicates the current travel location of the conveyance vehicle 6.

The communicator 56 of the controller 8 receives the response signal transmitted from the conveyance vehicle 6 (S106). On the basis of the received response signal, the controller 60 of the controller 8 determines the current travel location of the conveyance vehicle 6. When the conveyance vehicle 6 is within a predetermined distance from the destination, the controller 60 of the controller 8 reads the IP address of the management device 18 from the storage 58 and the communicator 56 transmits the read IP address of the management device 18 to the conveyance vehicle 6 (S107). In contrast, when the conveyance vehicle 6 is spaced away more than the predetermined distance from the destination, the controller 60 of the controller 8 returns to Step S103 to transmit the inquiry signal to the conveyance vehicle 6.

The communicator 50 of the conveyance vehicle 6 receives the IP address of the management device 18 from the controller 8 (S108). The IP address of the management device 18 is stored into the storage 52. The communicator 50 of the conveyance vehicle 6 specifies the received IP address of the management device 18 as the recipient (the destination) and transmits a request signal generated by the controller 54 to the management device 18 (S109). The request signal is a command for requesting the management device 18 to transmit an IP address of the communication device corresponding to the destination of the conveyance vehicle 6. The request signal includes (a) the station number "ST1", (b) the load port number "LP1", and (c) an E84 communication sequence number, for example.

The communicator 78 of the management device 18 receives the request signal transmitted from the conveyance vehicle 6 (S110). On the basis of the received request signal, the controller 82 of the management device 18 extracts, from the management table stored in the storage 80, the IP address "xx.xx.xx.xx" of the first communication device 14 corresponding to the station number "ST1" indicating the destination of the conveyance vehicle 6 (S111). The communicator 78 transmits the extracted IP address of the first communication device 14 to the conveyance vehicle 6 (S112).

The communicator 50 of the conveyance vehicle 6 receives the IP address of the first communication device 14 from the management device 18 (S113). The IP address of the first communication device 14 is stored into the storage 52. The communicator 50 of the conveyance vehicle 6 specifies the received IP address of the first communication device 14 as the recipient and transmits a message signal generated by the controller 54 to the first communication device 14 (S114). The message signal refers to a command for requesting the first communication device 14, for example, to start the interlock process to transfer the FOUP 4 between the conveyance vehicle 6 and the load port 32a of the first semiconductor manufacturing device 10. The message signal includes (a) the station number "ST1", (b) the load port number "LP1", (c) the E84 communication sequence number, (d) loading/unloading request data used for executing the interlock process, and (e) a conveyance vehicle identification (ID) for identifying the conveyance vehicle 6, for example.

The communicator 70 of the first communication device 14 receives the message signal from the conveyance vehicle 6 (S115). On the basis of the received message signal, the controller 72 of the first communication device 14 communicates with the conveyance vehicle 6 to execute the interlock process (S116). As a result, the interlock process is executed to transfer the FOUP 4 between the conveyance vehicle 6 and the load port 32a.

Note that the first communication device 14 may not perform all the operations included in the interlock process by communicating with the conveyance vehicle 6. The first communication device 14 may perform some of the operations included in the interlock process by communicating with the conveyance vehicle 6, and perform the rest of the operations by communicating with the first semiconductor manufacturing device 10.

[1-4. Advantageous Effects]

Next, advantageous effects achieved by the conveyance system 2 according to the present preferred embodiment are described by comparison with a conveyance system according to a comparative example.

The conveyance system according to the comparative example does not include the management device 18 described in the present preferred embodiment. Each of a plurality of conveyance vehicles stores a data table that stores identification information for each of a plurality of semiconductor manufacturing devices in association with an IP address of a communication device connected to the semiconductor manufacturing device. Each of the plurality of conveyance vehicles specifies, as a recipient, the IP address of the communication device read from the data table and transmits a message signal to this communication device.

For example, if any semiconductor manufacturing device is added, removed, or changed, the IP address of the communication device may be changed. One conveyance system includes 10000 semiconductor manufacturing devices and 3000 conveyance vehicles, for example. In this case, each data table stores 10000 IP addresses. Thus, it is not easy to update the data table for each of the 3000 conveyance vehicles. Moreover, the management of the data tables is not easy. To update the data tables, all the conveyance vehicles need to be stopped. This may interfere with a semiconductor manufacturing line.

In contrast, the management device 18 of the conveyance system 2 according to the present preferred embodiment stores the management table indicating the correspondence between each of the station numbers of the semiconductor manufacturing devices and the corresponding one of the IP addresses of the communication devices. This allows the management device 18 to collectively manage the IP addresses of the plurality of the communication devices. Even if the IP address of the communication device is changed because of addition, removal or change of any semiconductor manufacturing device, for example, only the management table stored in the management device 18 has to be updated. This enables easy management of the management table. To update the management table, the conveyance vehicles do not need to be stopped. Thus, the semiconductor manufacturing line is not interfered with.

Here, a conveyance system including both the control device and the management device 18 as a single control device may be conceivable. However, updating of a management table stored in the control device of this conveyance system may restrict an operation of the control device, thereby interfering with a semiconductor manufacturing line. On the other hand, the conveyance system 2 according to the present preferred embodiment includes the controller 8 and the management device 18 separately. Hence, updating of the management table does not interfere with the semiconductor manufacturing line.

[1-5. Variation]

The management table according to the present preferred embodiment stores each of the station numbers of the first semiconductor manufacturing device 10 and the second semiconductor manufacturing device 12 in association with the corresponding one of the IP addresses of the first component device 14 and the second communication device 16. In addition to this, communication attribute information indicating a communication attribute for each of the first communication device 14 and the second communication device 16 may be stored as well. Examples of the communication attribute information include (a) a communication method (whether wireless or wired communication), (b) channel information of wireless communication, and (c) a service set identifier (SSID) for wireless communication.

In this case, the communicator 78 of the management device 18 transmits the IP address of the first communication device 14 and the communication attribute information of the first communication device 14 to the conveyance vehicle 6 in Step S112 described above. Then, on the basis of the received communication attribute information of the first communication device 14, the communicator 50 of the conveyance vehicle 6 transmits a message signal to the first communication device 14 in Step S114 described above.

Preferred Embodiment 2

[2-1. Functional Configuration of Conveyance System]

Figure 5:
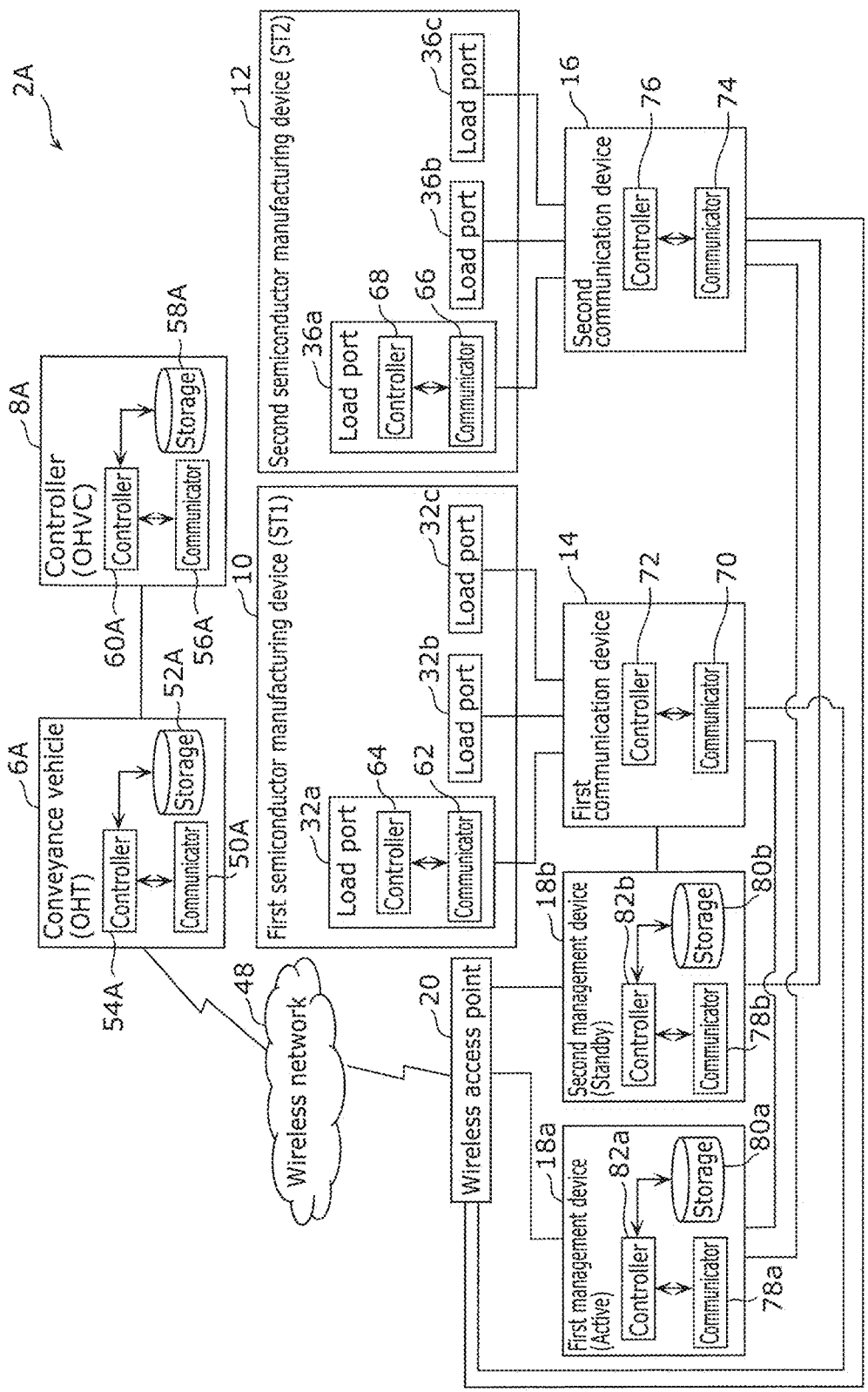
FIG. 5 is a block diagram illustrating a functional configuration of a conveyance system according to Preferred Embodiment 2 of the present invention.

Next, a functional configuration of a conveyance system 2A according to Preferred Embodiment 2 is described with reference to FIG. 5. FIG. 5 is a block diagram illustrating the functional configuration of the conveyance system 2A according to Preferred Embodiment 2. In each of the following preferred embodiments, a component that is the same as that described in Preferred Embodiment 1 is assigned the same reference sign used in Preferred Embodiment 1, and description on this component is not repeated.

As illustrated in FIG. 5, the conveyance system 2A according to Preferred Embodiment 2 is different from the system according to Preferred Embodiment 1 in that the conveyance system 2A is designed with redundancy by including a first management device 18a that is active in operation and a second management device 18b that is on standby in idle. The first management device 18a includes a communicator 78a, a storage 80a, and a controller 82a. The second management device 18b includes a communicator 78b, a storage 80b, and a controller 82b. Each of the first management device 18a and the second management device 18b has the same configuration as the management device 18 in Preferred Embodiment 1 described above.

A storage 58A of a controller 8A stores an IP address of the first management device 18a (an example of a first-management-device address information) and an IP address of the second management device 18b (an example of a second-management-device address information), instead of the IP address of the management device 18 described above in Preferred Embodiment 1.

Each of storages 52A of a plurality of conveyance vehicles 6A temporarily stores the IP address of the first management device 18a and the IP address of the second management device 18b, instead of the IP address of the management device 18 described above in Preferred Embodiment 1.

[2-2. Operation Performed by Conveyance System]

Figure 6:
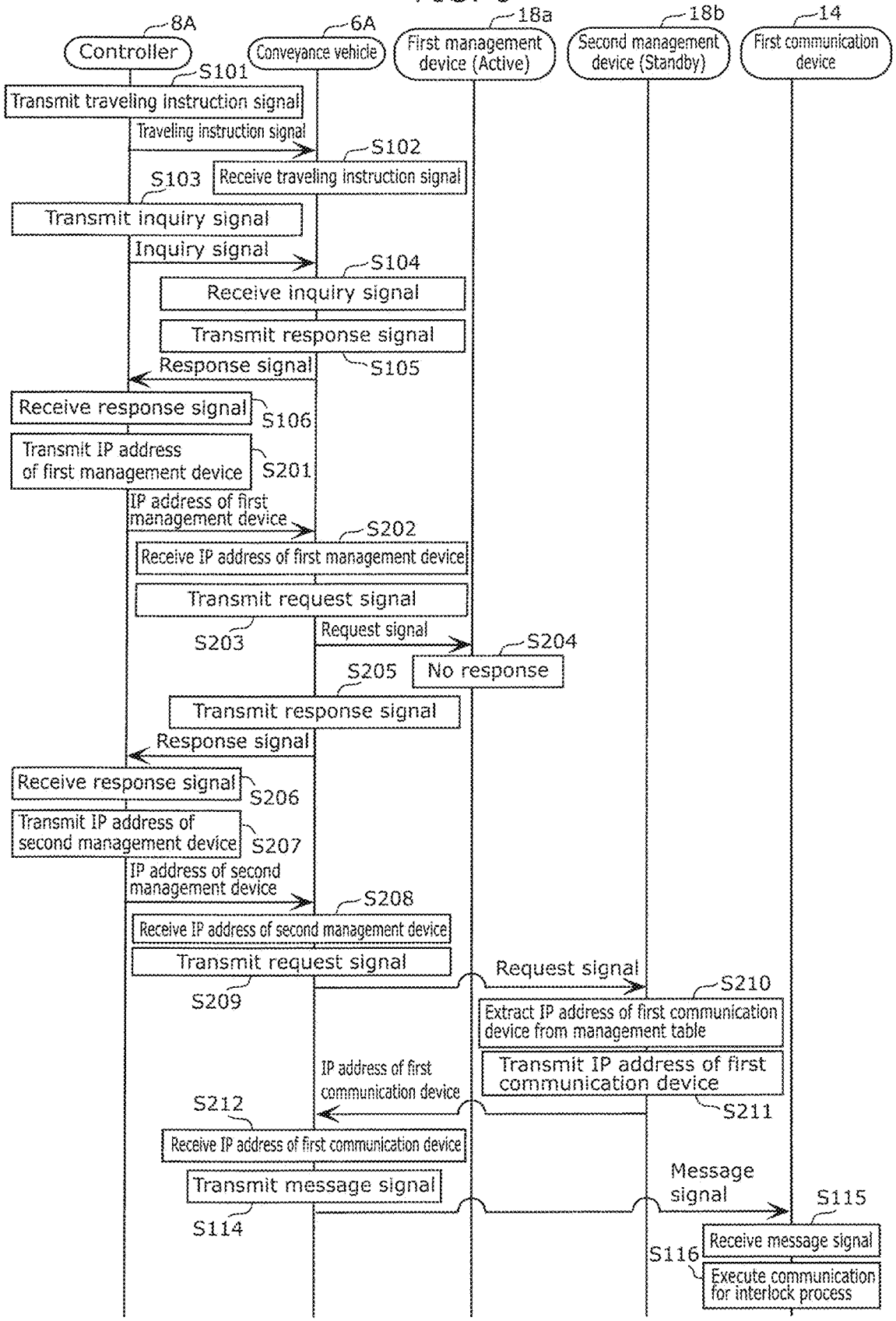
FIG. 6 is a sequence diagram illustrating an operation performed by the conveyance system according to Preferred Embodiment 2 of the present invention.

Next, an operation performed by the conveyance system 2A according to Preferred Embodiment 2 is described with reference to FIG. 6. FIG. 6 is a sequence diagram illustrating the operation performed by the conveyance system 2A according to Preferred Embodiment 2. In FIG. 6, the same operation as that included in FIG. 4 of Preferred Embodiment 1 is assigned the same step number used in FIG. 4, and description on this operation is not repeated.

The following describes, as an example, the operation performed by the conveyance system 2A when the conveyance vehicle 6A transfers a FOUP 4 (see FIG. 1) to and from a load port 32a of a first semiconductor manufacturing device 10. The description is presented on the assumption that a communication failure is occurring between the conveyance vehicle 6A and the first management device 18a.

As illustrated in FIG. 6, Steps S101 to S106 are first executed as in Preferred Embodiment 1 described above. After this, when the conveyance vehicle 6A is approaching the destination, the controller 60A of the controller 8A reads the IP address of the first management device 18a, which is active, from the storage 58A. The communicator 56A of the controller 8A transmits the read IP address of the first management device 18a to the conveyance vehicle 6A (S201).

The communicator 50A of the conveyance vehicle 6A receives the IP address of the first management device 18a from the controller 8A (S202). The IP address of the first management device 18a is stored into the storage 52A. The communicator 50A of the conveyance vehicle 6A specifies the received IP address of the first management device 18a as the recipient and transmits a request signal generated by a controller 54A to the first management device 18a (S203). This request signal is a command for requesting the first management device 18a to transmit an IP address of the communication device corresponding to the destination of the conveyance vehicle 6A.

Here, because a communication failure is occurring between the conveyance vehicle 6A and the first management device 18a, the communicator 78a of the first management device 18a is unable to receive the request signal transmitted from the conveyance vehicle 6A and thus transmits no response to the request signal (S204).

If no response is received from the first management device 18a after a lapse of a predetermined time period from the transmission of the request signal, the communicator 50A of the conveyance vehicle 6A transmits a response signal generated by the controller 54A to the controller 8A (S205). The response signal indicates that no response has been received from the first management device 18a.

The communicator 56A of the controller 8A receives the response signal transmitted from the conveyance vehicle 6A (S206). Although not illustrated in FIG. 6, the controller 60A of the controller 8A determines that the conveyance vehicle 6A has received no response from the first management device 18a, on the basis of the received response signal. Thus, the controller 60A of the controller 8A reads the IP address of the second management device 18b, which is on standby, from the storage 58A, and then transmits the read IP address of the second management device 18b to the conveyance vehicle 6A (S207).

The communicator 50A of the conveyance vehicle 6A receives the IP address of the second management device 18b from the controller 8A (S208). The IP address of the second management device 18b is stored into the storage 52A. The communicator 50A of the conveyance vehicle 6A specifies the received IP address of the second management device 18b as the recipient and transmits a request signal generated by the controller 54A to the second management device 18b (S209). This request signal is a command for requesting the second management device 18b to transmit an IP address of the communication device corresponding to the destination of the conveyance vehicle 6A.

On the basis of the received request signal, the controller 82b of the second management device 18b extracts, from a management table stored in the storage 80b, the IP address "xx.xx.xx.xx" of the first communication device 14 corresponding to the station number "ST1" indicating the destination of the conveyance vehicle 6A (S210). The communicator 78b transmits the extracted IP address of the first communication device 14 to the conveyance vehicle 6A (S211).

The communicator 50A of the conveyance vehicle 6A receives the IP address of the first communication device 14 from the second management device 18b (S212). The IP address of the first communication device 14 is stored into the storage 52A. After this, Steps S114 to S116 are executed as in Preferred Embodiment 1 described above.

In the sequence according to Preferred Embodiment 2, the conveyance vehicle 6A receives the IP address of the first communication device 14 from either one of the two management devices (the first management device 18a and the second management device 18b). However, this is not intended to be limiting. For example, if the IP address of the first communication device 14 cannot be received from the second management device 18b either, the conveyance vehicle 6A may receive the IP address of the first communication device 14 from a third management device for instance. To be more specific, various preferred embodiments of the present invention are applicable to the conveyance system 2A that is designed with redundancy by including a plurality of management devices.

[2-3. Advantageous Effects]

According to the present preferred embodiment, redundancy can be achieved by the use of the first management device 18a, which is active, and the second management device 18b, which is on standby. Even with this configuration, each of the first management device 18a and the second management device 18b stores the management table. This enables collective management of the IP addresses of the plurality of communication devices.

[2-4. Variations]

[2-4-1. Variation 1]

In Step S201 described above according to the present preferred embodiment, the communicator 56A of the controller 8A transmits only the IP address of the first management device 18a to the conveyance vehicle 6A. Instead of this process, the communicator 56A may transmit the IP addresses of the first management device 18a and the second management device 18b at one time in Step S201 according to Variation 1. At this time, the communicator 56A also transmits, to the conveyance vehicle 6A, information indicating that the first management device 18a is active and that the second management device 18b is on standby.

In this case, the controller 54A of the conveyance vehicle 6A selects the IP address of the first management device 18a between the received IP addresses of the first management device 18a and the second management device 18b. The communicator 50A of the conveyance vehicle 6A specifies the selected IP address of the management device 18a as the recipient and transmits a request signal to the first management device 18a.

Here, if no response is received from the first management device 18a, the controller 54A of the conveyance vehicle 6A selects the IP address of the second management device 18b. The communicator 50A of the conveyance vehicle 6A specifies the selected IP address of the second management device 18b as the recipient and transmits a request signal to the second management device 18b.

More specifically, because the both IP addresses of the first management device 18a and the second management device 18b are received from the controller 8A beforehand, the controller 54A of the conveyance vehicle 6A is able to immediately communicate with the first communication device 14 via the second management device 18b, which is on standby. In this way, a time required to switch between communication paths (to achieve redundancy) can be reduced according to Variation 1.

[2-4-2. Variation 2]

The communicator 56A of the controller 8A may transmit beforehand the IP addresses of the first management device 18a and the second management device 18b to the conveyance vehicle 6A before Step S201 (in Step S101, for example) according to Variation 2. This allows the conveyance vehicle 6A to transmit the request signal to the first management device 18a and the second management device 18b earlier to execute communication for the interlock process earlier.

[2-4-3. Variation 3]

The IP addresses of the first management device 18a and the second management device 18b may be stored as a history into the storage 52A of the conveyance vehicle 6A according to Variation 3. In this case, while the sequence illustrated in FIG. 6 is repeated, the conveyance vehicle 6A may read the IP address of the first management device 18a and the IP address of the second management device 18b from the storage 52A instead of executing Steps S201, S202, S207, and S208.

Preferred Embodiment 3

[3-1. Functional Configuration of Conveyance System]

Figure 7:
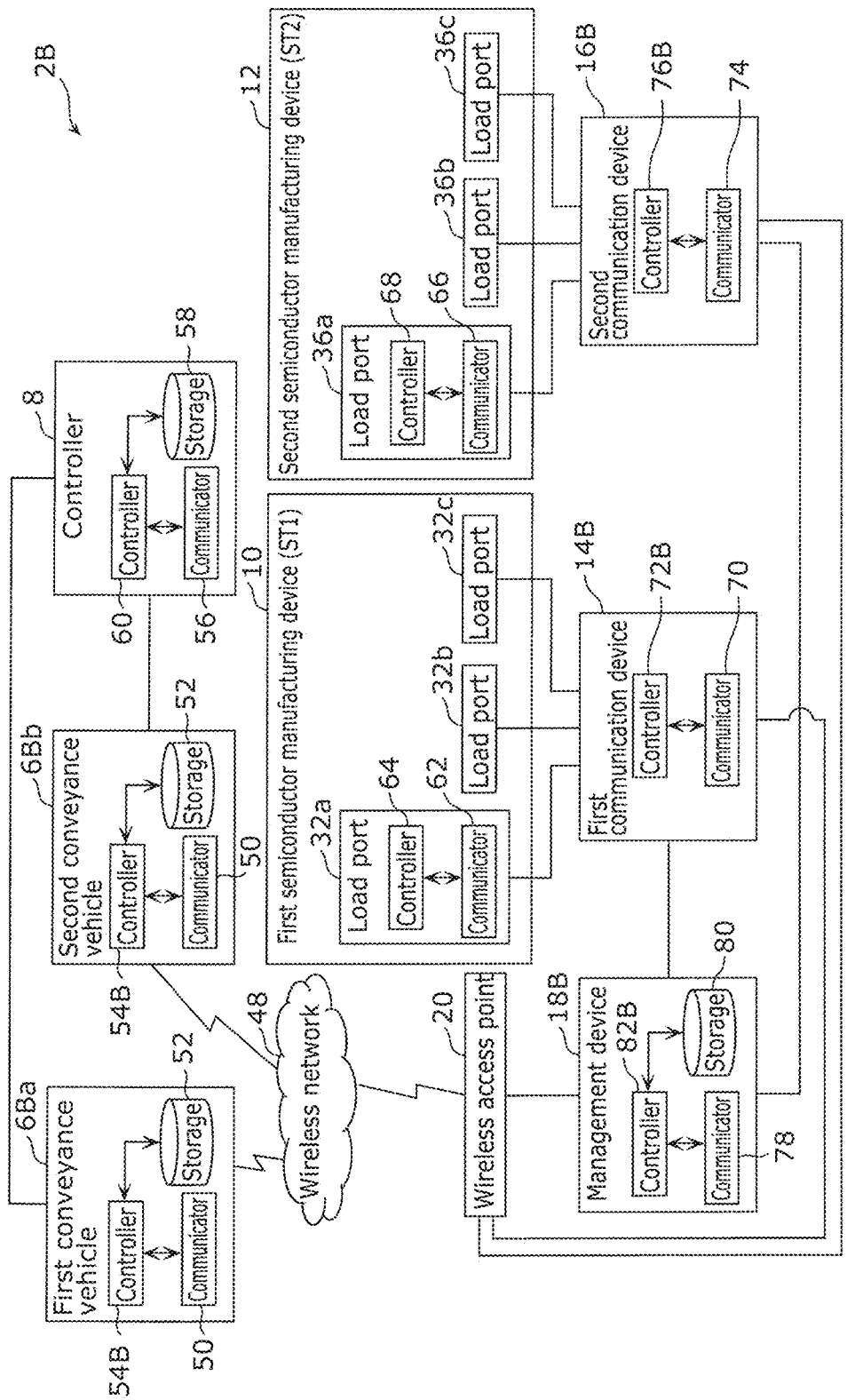
FIG. 7 is a block diagram illustrating a functional configuration of a conveyance system according to Preferred Embodiment 3 of the present invention.

A functional configuration of a conveyance system 2B according to Preferred Embodiment 3 is described with reference to FIG. 7. FIG. 7 is a block diagram illustrating the functional configuration of the conveyance system 2B according to Preferred Embodiment 3.

As illustrated in FIG. 7, the conveyance system 2B according to Preferred Embodiment 3 includes a plurality of conveyance vehicles including a first conveyance vehicle 6Ba and a second conveyance vehicle 6Bb. The first conveyance vehicle 6Ba has the following function in addition to the function of the conveyance vehicle 6 (see FIG. 2) described in Preferred Embodiment 1 above. More specifically, when a FOUP 4 (an example of a first conveyance subject referred to as the "first FOUP 4" hereinafter) (see FIG. 1) is transferred (unloaded) from the first conveyance vehicle 6Ba to a load port 32a of a first semiconductor manufacturing device 10, a controller 54B of the first conveyance vehicle 6Ba makes an inquiry of a management device 18B about whether a different FOUP 4 (an example of a second conveyance subject referred to as the "second FOUP 4" hereinafter) is present above the load port 32a. On the basis of a result given in response to the inquiry, the controller 54B of the first conveyance vehicle 6Ba adopts either a first traveling plan or a second traveling plan described later. Note that a controller 54B of the second conveyance vehicle 6Bb has the same function as that of the controller 54B of the first conveyance vehicle 6Ba.

Here, when "the second FOUP 4 is present above the load port 32a", this means that the second FOUP 4 is placed on the load port 32a or is currently being transferred (loaded) from the load port 32a to the second conveyance vehicle 6Bb.

A controller 72B of the first communication device 14B generates conveyance-subject information indicating, for example, whether the second FOUP 4 is present above the load port 32a. To generate the information, the controller 72B of the first communication device 14B determines whether the second FOUP 4 is present above the load port 32a on the basis of, for example, communication established with the second conveyance vehicle 6Bb for the interlock process. Note that a controller 76B of the second communication device 16B has the same function as that of the controller 72B of the first communication device 14B.

A controller 82B of the management device 18B receives the conveyance-subject information from the first communication device 14B. In response to the aforementioned inquiry from the first conveyance vehicle 6Ba (or the second conveyance vehicle 6Bb) as to whether the second FOUP 4 is present above the load port 32a, a communicator 78 of the management device 18B transmits a response signal indicating the received conveyance-subject information to the first conveyance vehicle 6Ba (or the second conveyance vehicle 6Bb).

[3-2. Operation Performed by Conveyance System]

Next, an operation performed by the conveyance system 2B according to Preferred Embodiment 3 is described with reference to FIG. 8 and FIG. 9. Each of FIG. 8 and FIG. 9 is a sequence diagram illustrating the operation performed by the conveyance system 2B according to Preferred Embodiment 3.

The following describes, as an example, the operation performed by the conveyance system 2B when the second FOUP 4 is determined as not being present above the load port 32a of the first semiconductor manufacturing device 10 as a result of the inquiry made by the management device 18B by the first conveyance vehicle 6Ba.

Figure 8:
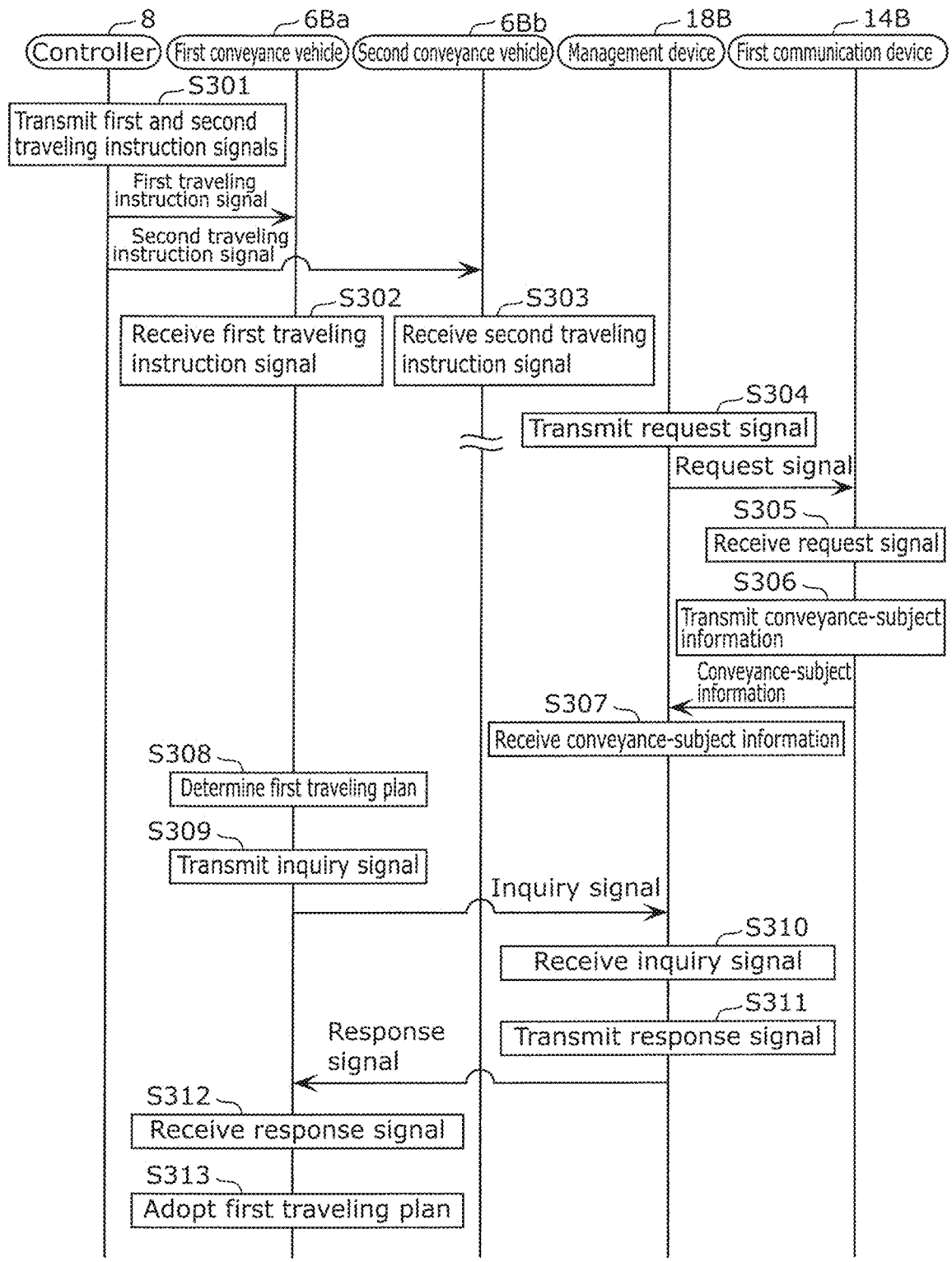
FIG. 8 is a sequence diagram illustrating an operation performed by the conveyance system according to Preferred Embodiment 3 of the present invention.
Figure 9:
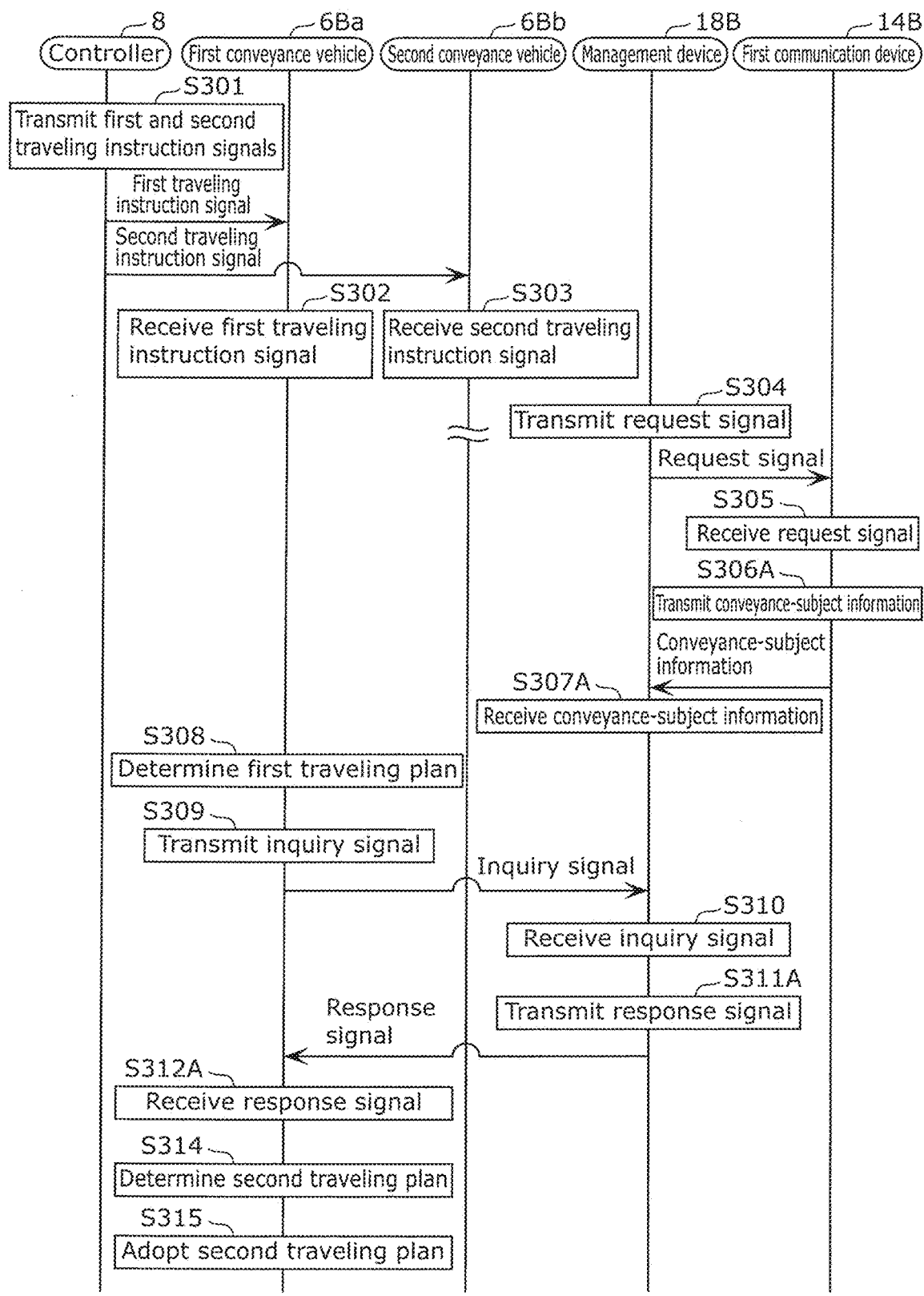
FIG. 9 is a sequence diagram illustrating an operation performed by the conveyance system according to Preferred Embodiment 3 of the present invention.

As illustrated in FIG. 8, a communicator 56 of a controller 8 transmits a first traveling instruction signal and a second traveling instruction signal to the first conveyance vehicle 6Ba and the second conveyance vehicle 6Bb, respectively (S301).

The first traveling instruction signal is a command for instructing the first conveyance vehicle 6Ba to travel to the position of the load port 32a of the first semiconductor manufacturing device 10 and then unload the first FOUP 4 from the first conveyance vehicle 6Ba to the load port 32a. Here, "the position of the load port 32a" refers to the position on a rail 22 directly above the load port 32a. The second traveling instruction signal is a command for instructing the second conveyance vehicle 6Bb to travel to the position of the load port 32a of the first semiconductor manufacturing device 10 and then load the second FOUP 4 placed on the load port 32a.

The first conveyance vehicle 6Ba receives the first traveling instruction signal transmitted from the controller 8 (S302). The second conveyance vehicle 6Bb receives the second traveling instruction signal transmitted from the controller 8 (S303).

The communicator 78 of the management device 18B transmits a request signal generated by the controller 82B to the first communicator device 14B (S304). The request signal is a command for instructing the first communication device 14B to transmit the conveyance-subject information indicating whether the second FOUP 4 is present above the load port 32a. Note that the communicator 78 transmits the request signal to the first communication device 14B at predetermined intervals (every two to three seconds, for example).

A communicator 70 of the first communicator device 14B receives the request signal transmitted from the management device 18B (S305). The controller 72B of the first communicator device 14B generates the conveyance-subject information in response to the received request signal.

At this time, loading of the second FOUP 4 has already been performed by the second conveyance vehicle 6Bb, the controller 72B of the first communicator device 14B generates the conveyance-subject information indicating that the second FOUP 4 is not present above the load port 32a.

Note that the process performed by the second conveyance vehicle 6Bb in response to the second traveling instruction signal is omitted from FIG. 8 for convenience of description.

The communicator 70 of the first communication device 14B transmits the conveyance-subject information to the management device 18B (S306). The communicator 70 of the management device 18B receives the conveyance-subject information transmitted from the first communication device 14B (S307). Here, Steps S304 to S307 described above are executed at predetermined intervals.

After receiving the first traveling instruction signal, the first conveyance vehicle 6Ba determines a first traveling plan on the basis of the first traveling instruction signal (S308). The first traveling plan indicates a first route, which is the shortest route from a current position to the position of the load port 32a of the first semiconductor manufacturing device 10.

A communicator 50 of the first conveyance vehicle 6Ba transmits an inquiry signal, to the management device 18B, to inquire whether the second FOUP 4 is to be present above the load port 32a at the moment when the first conveyance vehicle 6Ba arrives at the position of the load port 32a (this moment corresponds to a first time), assuming that the first conveyance vehicle 6Bas is to arrive at the position of the load port 32a by following the first traveling plan (S309).

The communicator 78 of the management device 18B receives the inquiry signal transmitted from the conveyance vehicle 6Ba (S310). In response to this signal, the communicator 78 of the management device 18B transmits a response signal generated by the controller 82B to the first conveyance vehicle 6Ba (S311). The response signal indicates that the second FOUP 4 is not present above the load port 32a.

The communicator 50 of the first conveyance vehicle 6Ba receives the response signal from the management device 18B (S312). On the basis of the received response signal, the controller 54B of the first conveyance vehicle 6Ba determines that the first FOUP 4 is allowed to be unloaded onto the load port 32a. Thus, the controller 54B adopts the first traveling plan (S313). As a result of this, on the basis of the first traveling plan, the first conveyance vehicle 6Ba follows the first route to travel from the current position to the position of the load port 32a of the first semiconductor manufacturing device 10.

After this, the steps from Step S103 in FIG. 4 are executed as in Preferred Embodiment 1 described above although not illustrated in FIG. 8.

The following describes, as an example, the operation performed by the conveyance system 2B when the second FOUP 4 is determined as being present above the load port 32a of the first semiconductor manufacturing device 10 as a result of the inquiry made of the management device 18B by the first conveyance vehicle 6Ba.

As illustrated in FIG. 9, Steps S301 to S305 are executed as described above with reference to FIG. 8. After Step S305, the controller 72B of the first communication device 14B generates conveyance-subject information on the basis of the received request signal. At this time, loading of the second FOUP 4 has not yet been performed by the second conveyance vehicle 6Bb, the controller 72B of the first communicator device 14B generates the conveyance-subject information indicating that the second FOUP 4 is present above the load port 32a. Note that the process performed by the second conveyance vehicle 6Bb in response to the second traveling instruction signal is omitted from FIG. 9 for convenience of description.

The communicator 70 of the first communication device 14B transmits the conveyance-subject information to the management device 18B (S306A). After this, Steps S307A to S310 are executed similarly to Steps S307 to S310 in FIG. 8. Following Step S310, the communicator 78 of the management device 18B transmits a response signal generated by the controller 82B to the first conveyance vehicle 6Ba (S311A). The response signal indicates that the second FOUP 4 is present above the load port 32a.

The communicator 50 of the first conveyance vehicle 6Ba receives the response signal from the management device 18B (S312A). On the basis of the received response signal, the controller 54B of the first conveyance vehicle 6Ba determines that the first FOUP 4 is not allowed to be unloaded onto the load port 32a. Thus, the controller 54B determines a second traveling plan (S314), and adopts the determined second traveling plan (S315). The second traveling plan indicates a second route that is longer than the first route and that is a roundabout route followed by the first conveyance vehicle 6Ba to reach the position of the load port 32a after loading of the second FOUP 4 by the second conveyance vehicle 6Bb has completed and thus the second FOUP 4 has left the position above the load port 32a.

At this time, on the basis of a loading start time at which loading of the second FOUP 4 by the second conveyance vehicle 6Bb is to be started and past time data on time taken for the loading, the management device 18B may calculate a loading completion time at which the loading is to be completed and transmit the calculated loading completion time to the first conveyance vehicle 6Ba. This allows the controller 54B of the first conveyance vehicle 6Ba to determine the second traveling plan on the basis of the loading completion time transmitted from the management device 18B.

As a result, until after the second conveyance vehicle 6Bb has completed the loading of the second FOUP 4, the first conveyance vehicle 6Ba detours around the position of the load port 32a according to the second traveling plan. Then, after the completion of the loading, the first conveyance vehicle 6Ba travels the second route to reach the position of the load port 32a.

After this, the steps from Step S103 in FIG. 4 are executed as in Preferred Embodiment 1 described above although not illustrated in FIG. 9.

[3-3. Advantageous Effects]

When the second FOUP 4 is not present above the load port 32a, the conveyance vehicle 6Ba adopts the first traveling plan indicating the first route that is relatively short, according to the present preferred embodiment (see FIG. 8). This allows the first conveyance vehicle 6Ba to travel to the position of the load port 32a earlier to start unloading earlier.

In contrast, when the second FOUP 4 is present above the load port 32a, the first conveyance vehicle 6Ba adopts the second traveling plan indicating the second route that is longer than the first route (see FIG. 9). This allows the first conveyance vehicle 6Ba to travel to the load port 32a without any unnecessary stop, and reduces congestion caused by the plurality of conveyance vehicles. Moreover, this can prevent disadvantages, such as an occurrence of an error because the first conveyance vehicle 6Ba travels to the position of the load port 32a to start the unloading even though the second FOUP 4 is placed on the load port 32a.

As described thus far, the efficiency of conveying the first and second FOUPs 4 is increased.

[3-4. Variation 1]

In the present preferred embodiment, the management device 18B is connected to each of the first communication device 14B and the second communication device 16B via the LAN cable 46. However, if the management device 18B supports only wireless communication, the following configuration may be used. To be more specific, the first conveyance vehicle 6Ba notifies the management device 18B via the wireless access point 20 about a communication situation of the interlock process. This allows the management device 18B to determine whether the second FOUP 4 is present above the load port 32a without making an inquiry of the first communication device 14B, for example.

[3-5. Variation 2]

In the present preferred embodiment, the controller 8 transmits the first traveling instruction signal and the second traveling instruction signal to the first conveyance vehicle 6Ba and the second conveyance vehicle 6Bb, respectively. However, the following configuration may be used, for example.

To be more specific, the controller 8 may transmit a third traveling instruction signal to a third conveyance vehicle. The third traveling instruction signal refers to a command for instructing the third conveyance vehicle to travel to the position of the load port 32a and then load a third FOUP from the load port 32a onto the third conveyance vehicle.

In this case, the management device 18 transmits a request signal to the first communication device 14B. The request signal refers to a command for requesting the first communication device 14B to transmit conveyance-subject information indicating whether the third FOUP is present above the load port 32a.

In response to the request signal transmitted from the management device 18B, the first communication device 14B transmits, to the management device 18B, the conveyance-subject information indicating whether the third FOUP is present above the load port 32a. The management device 18B receives the conveyance-subject information transmitted from the first communication device 14B.

After receiving the third traveling instruction signal, the third conveyance vehicle determines a third traveling plan on the basis of the third traveling instruction signal. The third traveling plan indicates a third route, which is the shortest route from a current position to the position of the load port 32a.

The third conveyance vehicle transmits an inquiry signal, to the management device 18B, to inquire whether the third FOUP is to be present above the load port 32a at the moment when the third conveyance vehicle arrives at the position of the load port 32a (this moment corresponds to a second time), assuming that the third conveyance vehicle is to arrive at the position of the load port 32a by following the third traveling plan.

In response to the inquiry signal transmitted from the third conveyance vehicle, the management device 18B transmits a response signal to the third conveyance vehicle.

If the response signal indicates that the third FOUP is present above the load port 32a, the third conveyance vehicle determines, on the basis of the received response signal, that the third FOUP is allowed to be unloaded from the load port 32a onto the third conveyance vehicle. Thus, the third conveyance vehicle adopts the third first traveling plan. As a result of this, on the basis of the third traveling plan, the third conveyance vehicle follows the third route to travel from the current position to the position of the load port 32a.

In contrast, if the response signal indicates that the third FOUP is not present above the load port 32a, the third conveyance vehicle determines, on the basis of the received response signal, that the third FOUP is not allowed to be unloaded from the load port 32a onto the third conveyance vehicle. Thus, the third conveyance vehicle determines a fourth traveling plan, and adopts the determined fourth traveling plan. The fourth traveling plan indicates a fourth route that is longer than the third route and that is a roundabout route followed by the third conveyance vehicle to reach the position of the load port 32a after loading of the third FOUP onto the load port 32a has completed. As a result, until after the loading of the third FOUP onto the load port 32a has been completed, the third conveyance vehicle detours around the position of the load port 32a according to the fourth traveling plan. Then, after the completion of the loading, the third conveyance vehicle travels the fourth route to reach the position of the load port 32a.

Preferred Embodiment 4

[4-1. Functional Configuration of Conveyance System]

Figure 10:
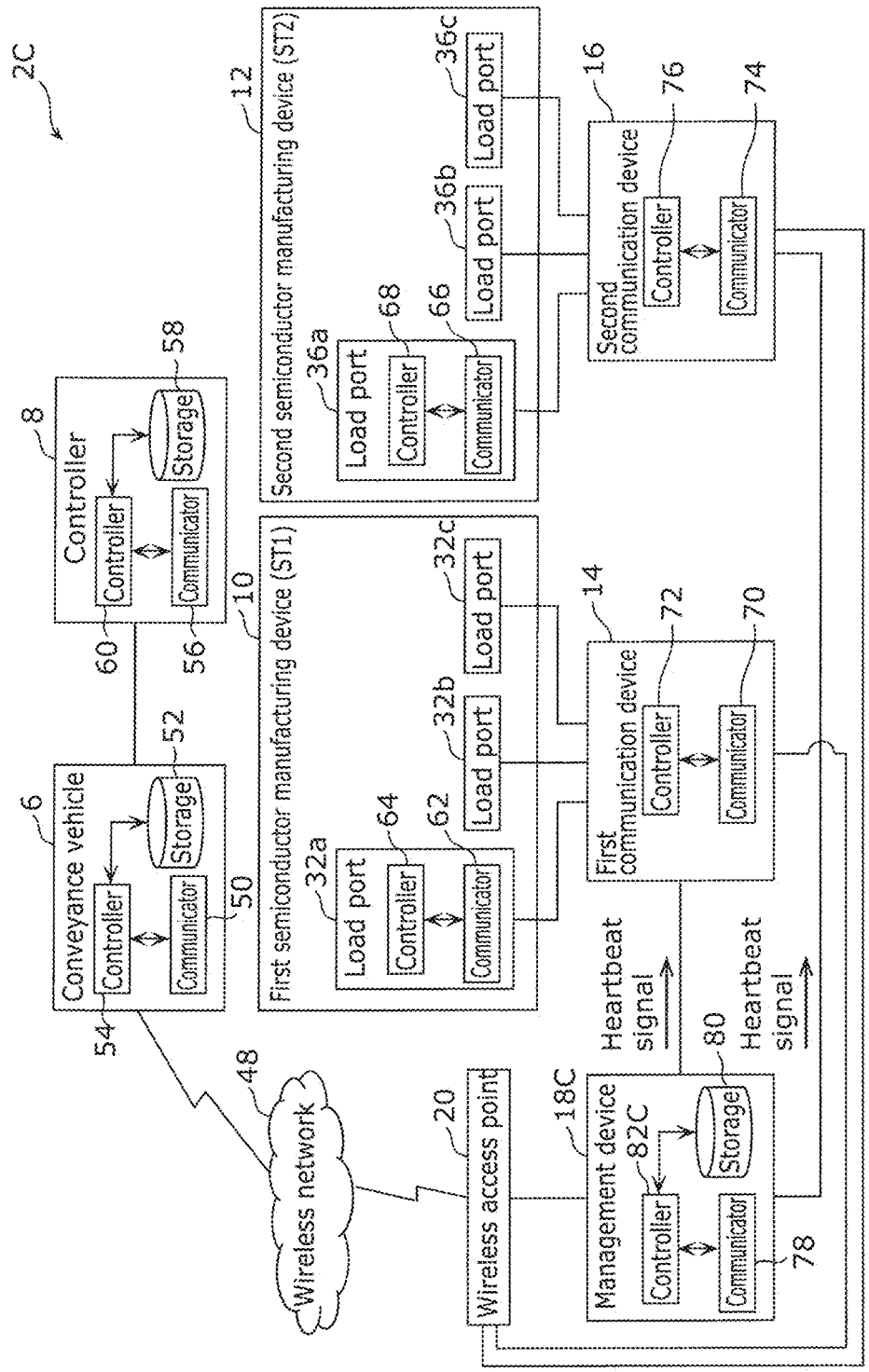
FIG. 10 is a block diagram illustrating a functional configuration of a conveyance system according to Preferred Embodiment 4 of the present invention.

A functional configuration of a conveyance system 2C according to Preferred Embodiment 4 is described with reference to FIG. 10. FIG. 10 is a block diagram illustrating the functional configuration of the conveyance system 2C according to Preferred Embodiment 4.

As illustrated in FIG. 10, the conveyance system 2C according to Preferred Embodiment 4 includes a management device 18C having a configuration different from the configuration of the management device according to Preferred Embodiment 1 described above. To be more specific, a controller 82C of the management device 18C generates a heartbeat signal and a communicator 78 transmits the generated heartbeat signal to a first communication device 14 and a second communication device 16. Depending on whether responses to the heartbeat signals have received from the first communication device 14 and the second communication device 16, the controller 82C determines whether the first communication device 14 and the second communication device 16 are capable of communication.

[4-2. Operation Performed by Management Device]

Figure 11:
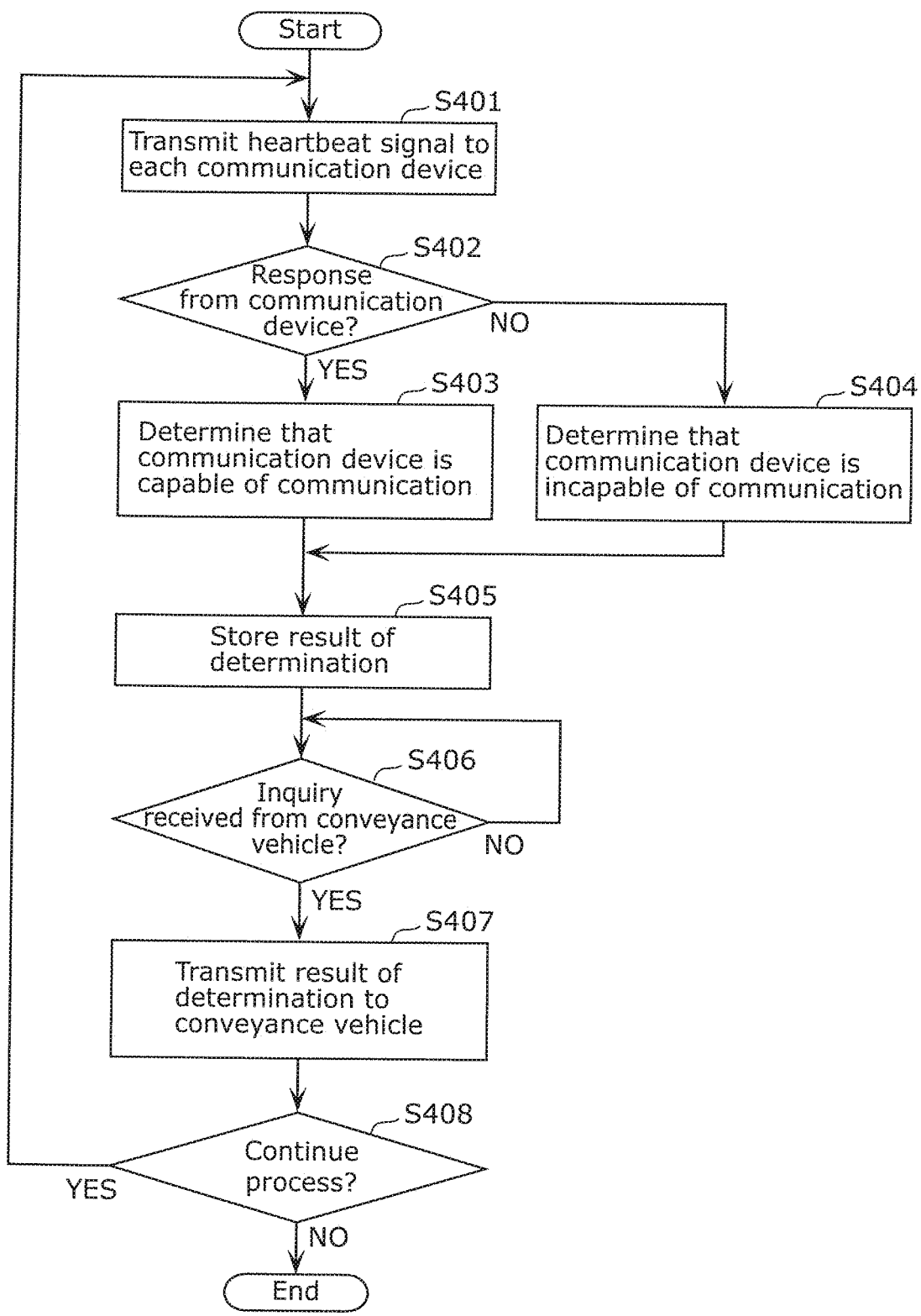
FIG. 11 is a flowchart illustrating an operation performed by a management device according to Preferred Embodiment 4 of the present invention.

Next, an operation performed by the management device 18C according to Preferred Embodiment 4 is described with reference to FIG. 11. FIG. 11 is a flowchart illustrating the operation performed by the management device 18C according to Preferred Embodiment 4.

As illustrated in FIG. 11, the communicator 78 of the management device 18C transmits the heartbeat signal generated by the controller 82C to each of the first communication device 14 and the second communication device 16 (S401).

The controller 82C of the management device 18C determines whether responses to the heartbeat signals have received from the first communication device 14 and the second communication device 16 transmit (S402). If the response to the heartbeat signal has been received from the first communication device 14 (or the second communication device 16) (YES in S402), the controller 82C of the management device 18C determines that the first communication device 14 (or the second communication device 16) is capable of communication (S403).

In contrast, if no response to the heartbeat signal has been received from the first communication device 14 (or the second communication device 16) (NO in S402), the controller 82C of the management device 18C determines that the first communication device 14 (or the second communication device 16) is incapable of communication (S404).

After Step S403 or S404, the controller 82C of the management device 18C stores the aforementioned result of the determination into a storage 80 (S405). Following this, the controller 82C of the management device 18C determines whether an inquiry signal has been received from a conveyance vehicle 6 (S406).

For example, before performing the interlock process with a load port 32a of a first semiconductor manufacturing device 10, the conveyance vehicle 6 transmits an inquiry signal to make an inquiry of the management device 18C about whether the first communication device is capable of communication. If receiving the inquiry signal from the conveyance vehicle 6 (YES in S406), the controller 82C of the management device 18C transmits, to the conveyance vehicle 6, a determination result signal indicating the result of the determination stored in the storage 80 (S407). If no inquiry signal is received from the conveyance vehicle 6 (NO in S406), the controller 82C of the management device 18C returns to Step S406 described above.

If receiving the result of the determination indicating that, for example, the first communication device 14 is capable of communication, the conveyance vehicle 6 starts the interlock process with the load port 32a of the first semiconductor manufacturing device 10. In contrast, if receiving the result of the determination indicating that, for example, the first communication device 14 is incapable of communication, the conveyance vehicle 6 notifies the controller 8 about this. In this case, following an instruction from the controller 8, the conveyance vehicle 6 puts the interlock process to be performed with the load port 32a of the first semiconductor manufacturing device 10 on hold and detours around the first semiconductor manufacturing device 10.

After this, if the management device 18C continues the process (YES in S408), the controller 82C returns to Step S401 described above. In contrast, if the management device 18C does not continue the process (NO in S408), the controller 82C ends the process.

[4-3. Advantageous Effects]

In the present preferred embodiment, the management device 18C can determine whether the first communication device 14 and the second communication device 16 are capable of communication. In accordance with the result of the determination made by the management device 18C, the conveyance vehicle 6 can accurately determine whether to start the interlock process with the load port 32a of the first semiconductor manufacturing device 10, for example.

For example, if the first communication device 14 is incapable of communication temporarily, the conveyance vehicle 6 may adopt a traveling plan indicating a traveling route by which the conveyance vehicle 6 travels a predetermined route before reaching the load port 32a. This allows the conveyance vehicle 6 to arrive at the load port 32a after recovering communication with the first communication device 14. More specifically, after arriving at the load port 32a, the conveyance vehicle 6 does not have to wait for the communication recovery. This reduces congestion caused by the plurality of conveyance vehicles 6 and thus increases conveyance efficiency.

If a conveyance system according to a comparative example does not include the management device 18C according to the present preferred embodiment but includes, for example, 8000 communication devices, a host system has to transmit the heartbeat signal to all these 8000 communication devices. In this case, a LAN band of a wireless communication path in the downstream direction is overwhelmed, causing a failure in the wireless communication of the conveyance vehicle 6.

In contrast, the present preferred embodiment enables 80 management devices 18C to share the management of the 8000 communication devices, for example. In this case, each of the management devices 18C transmits the heartbeat signal to 100 communication devices. This prevents the LAN band of the wireless communication path from being overwhelmed.

To verify a communication status for each of the 8000 communication devices, the host system can efficiently obtain, from each of the 80 management devices 18C, the communication statues of the corresponding 100 communication devices collectively.

[4-4. Variation]

In the present preferred embodiment, the management device 18C is connected to each of the first communication device 14 and the second communication device 16 via the LAN cable 46. However, if the management device 18C supports only wireless communication, the following configuration may be used. To be more specific, if receiving no response from the first communication device 14 (or the second communication device 16) when attempting to establish communication for the interlock process with the first communication device 14 (or the second communication device 16) via the wireless access point 20, for example, the conveyance vehicle 6 may determine that the first communication device 14 (or the second communication device 16) is incapable of communication.

In this case, the conveyance vehicle 6 transmits the result of the determination to the management device 18C via the wireless access point 20. This enables the management device 18C to determine whether the first communication device 14 and the second communication device 16 are capable of communication.

(Other Variations Etc.)

Although the methods for controlling conveyance systems, the conveyance systems, and the management devices according to the aspects of preferred embodiments of the present invention have been described based on Preferred Embodiments 1 to 4, the present disclosure is not limited to the preferred embodiments described. Those skilled in the art will readily appreciate that preferred embodiments arrived at by making various modifications to the above preferred embodiment or preferred embodiments arrived at by selectively combining elements disclosed in the above preferred embodiments may be included within one or more aspects of the present invention.

In each of the preferred embodiments described above, the first semiconductor manufacturing device 10 is connected to the first communication device 14 (14B) on a one-to-one basis. However, this is not intended to be limiting. The first communication device 14 (14B) may be connected to each of the plurality of load ports 32a, 32b, and 32c on a one-to-one basis. In this case, the management table stored in the management device 18 (18a, 18b, 18B, and 18C) stores the station number of the first semiconductor manufacturing device 10, the load port numbers of the plurality of load ports 32a, 32b, and 32c, and the IP addresses of the plurality of first communication devices 14 (14B) connected, respectively, to the plurality of the load ports 32a, 32b, and 32c, in association with each other, for example. In this case, a combination of the station number and the load port number is an example of the transfer location information indicating the transfer location of the FOUP 4.

In each of the preferred embodiments described above, the conveyance vehicle 6 (6A, 6Ba, 6Bb) communicates wirelessly with each of the first communication device 14 (14B) and the second communication device 16 (16B) via the wireless access point 20. However, this is not intended to be limiting. For example, the conveyance vehicle 6 (6A, 6Ba, 6Bb) may communicate directly with each of the first communication device 14 (14B) and the second communication device 16 (16B) without involving the wireless access point 20.

INDUSTRIAL APPLICABILITY

The conveyance systems according to preferred embodiments of the present invention are applicable to semiconductor manufacturing systems that convey FOUPs using conveyance vehicles traveling along rails mounted on ceilings, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

The invention claimed is:

1. A method for controlling a conveyance system that includes a plurality of conveyance vehicles that convey conveyance subjects, a plurality of transfer devices to and from which the conveyance subjects are transferred by the plurality of conveyance vehicles, a plurality of communication devices each of which is connected to a corresponding one of the plurality of transfer devices, and a management device that manages the plurality of communication devices, each of the plurality of conveyance vehicles including a first storage that stores specific transfer location information indicating a transfer location of a conveyance subject in a specific transfer device among the plurality of transfer devices, the management device including a second storage that stores correspondence information indicating a correspondence between transfer location information indicating a transfer location of the conveyance subject for each one of the plurality of transfer devices and communication-device address information indicating an address of a corresponding one of the plurality of communication devices that is connected to the one of the plurality of transfer devices, the method comprising:
  (a) transmitting, by a specific conveyance vehicle among the plurality of conveyance vehicles, the specific transfer location information to the management device;
  (b) extracting, from the correspondence information by the management device, specific communication-device address information corresponding to the specific transfer location information received from the specific conveyance vehicle, and transmitting, to the specific conveyance vehicle by the management device, the specific communication-device address information extracted; and
  (c) executing, by the specific conveyance vehicle, communication with a specific communication device among the plurality of communication devices that is connected to the specific transfer device, using the specific communication-device address information received from the management device, the communication being executed to transfer the conveyance subject between the specific transfer device and the specific conveyance vehicle.

2. The method according to claim 1, wherein
the conveyance system further includes a controller that controls traveling of the plurality of conveyance vehicles;
the method further comprising:
  (d) receiving, by the specific conveyance vehicle from the controller, management-device address information indicating an address of the management device; and
  in (a), the specific conveyance vehicle transmits the specific transfer location information to the management device using the management-device address information received from the controller.

3. The method according to claim 2, wherein
the management device in the conveyance system includes a plurality of management devices including a first management device and a second management device;
in (d), the specific conveyance vehicle receives, from the controller, a plurality of management-device address information pieces each indicating an address of a corresponding one of the management devices; and
in (a), the specific conveyance vehicle selects first management-device address information indicating an address of the first management device from among the plurality of management-device address information pieces received from the controller and transmits the specific transfer location information to the first management device using the first management-device address information.

4. The method according to claim 3, further comprising
(e) selecting, by the specific conveyance vehicle, second management-device address information indicating an address of the second management device from among the plurality of management-device address information pieces received from the controller and transmitting, by the specific conveyance vehicle, the specific transfer location information to the second management device using the second management-device address information, if communication with the first management device is unavailable in (a).

5. The method according to claim 2, wherein
the management device in the conveyance system includes a plurality of management devices including a first management device and a second management device;
in (d), the specific conveyance vehicle receives, from the controller, first management-device address information indicating an address of the first management device;
in (a), the specific conveyance vehicle transmits the specific transfer location information to the first management device using the first management-device address information received from the controller; and
the method further comprises:
(f) receiving, by the specific conveyance vehicle from the controller, second management-device address information indicating an address of the second management device, if communication with the first management device is unavailable in (a); and
(g) transmitting, to the second management device by the specific conveyance vehicle, the specific transfer location information using the second management-device address information received from the controller.

6. The method according to claim 2, further comprising:
(h) transmitting, by the controller, a first traveling instruction signal to instruct a first conveyance vehicle among the plurality of conveyance vehicles to travel to a position of the specific transfer device and transfer a first conveyance subject from the first conveyance vehicle to the specific transfer device;
(i) obtaining, by the management device, conveyance-subject information indicating whether a second conveyance subject is present above the specific transfer device;
(j) determining, by the first conveyance vehicle after receiving the first traveling instruction signal, a first traveling plan indicating a first route by which the first conveyance vehicle travels from a current position to the position of the specific transfer device;
(k) making an inquiry of the management device about whether the second conveyance subject is to be present above the specific transfer device at a first time, assuming that the first conveyance vehicle is to arrive at the position of the specific transfer device at the first time by following the first traveling plan; and
(l) (1) adopting, by the first conveyance vehicle, the first traveling plan if a result indicating that the second conveyance subject is not present above the specific transfer device is received from the management device in response to the inquiry, and (2) determining, by the first conveyance vehicle, a second traveling plan different from the first traveling plan and adopting the determined second traveling plan if a result indicating that the second conveyance subject is present above the specific transfer device is received from the management device in response to the inquiry; wherein the second traveling plan indicates a second route that is longer than the first route and that is followed by the first conveyance vehicle to reach the position of the specific transfer device after transfer of the second conveyance subject from the specific transfer device to a second conveyance vehicle among the plurality of conveyance vehicles has completed and the second conveyance subject has left the position above the specific transfer device.

7. The method according to claim 2, further comprising:
(m) transmitting, by the controller, a third traveling instruction signal to instruct a third conveyance vehicle among the plurality of conveyance vehicles to travel to a position of the specific transfer device and transfer a third conveyance subject from the specific transfer device to the third conveyance vehicle;
(n) obtaining, by the management device, conveyance-subject information indicating whether the third conveyance subject is present above the specific transfer device;
(o) determining, by the third conveyance vehicle after receiving the third traveling instruction signal, a third traveling plan indicating a third route by which the third conveyance vehicle travels from a current position to the position of the specific transfer device;
(p) making an inquiry of the management device about whether the third conveyance subject is to be present above the specific transfer device at a second time, assuming that the third conveyance vehicle is to arrive at the position of the specific transfer device at the second time by following the third traveling plan; and
(q) (1) adopting, by the third conveyance vehicle, the third traveling plan if a result indicating that the third conveyance subject is present above the specific transfer device is received from the management device in response to the inquiry, and (2) determining, by the third conveyance vehicle, a fourth traveling plan different from the third traveling plan and adopting the determined fourth traveling plan if a result indicating that the third conveyance subject is not present above the specific transfer device is received from the management device in response to the inquiry; wherein
the fourth traveling plan indicates a fourth route that is longer than the third route and that is followed by the third conveyance vehicle to reach the position of the specific transfer device after transfer of the third conveyance subject to the specific transfer device has completed.

8. The method according to claim 7, further comprising:
(r) transmitting, by the controller, a second traveling instruction signal, while the second conveyance subject is placed on the specific transfer device, to instruct the second conveyance vehicle to travel to the position of the specific transfer device and transfer the second conveyance subject from the specific transfer device to the second conveyance vehicle.

9. The method according to claim 1, wherein
the conveyance system further includes a wireless access point;
in (a), the specific conveyance vehicle transmits the specific transfer location information to the management device via the wireless access point;
in (b), the management device transmits the specific communication-device address information to the specific conveyance vehicle via the wireless access point; and
in (c), the specific conveyance vehicle executes the communication with the specific communication device via the wireless access point.

10. The method according to claim 9, further comprising:
(s) if no response is received from the specific communication device when the specific conveyance vehicle attempts to establish the communication with the specific communication device via the wireless access point in (c), determining by the specific conveyance vehicle that the specific communication device is incapable of communication and notifying the management device by the specific conveyance vehicle about a result of the determining via the wireless access point.

11. The method according to claim 1, further comprising:
(t) transmitting, by the management device, a heartbeat signal to each of the plurality of communication devices; and
(u) if the management device receives a response to the heartbeat signal from a communication device among the plurality of communication devices, determining by the management device that the communication device is capable of communication, and if the management device receives no response to the heartbeat signal from a communication device among the plurality of communication devices, determining by the management device that the communication device is incapable of communication.

12. The method according to claim 1, wherein
the correspondence information further includes communication attribute information indicating a communication attribute of the corresponding one of the plurality of communication devices in association with the transfer location information and the management-device address information;
in (b), the management device extracts, from the correspondence information, the specific communication-device address information and specific communication attribute information corresponding to the specific transfer location information received from the specific conveyance vehicle and transmits, to the specific conveyance vehicle, the specific communication-device address information extracted and the specific communication attribute information extracted; and
in (c), the specific conveyance vehicle executes the communication with the specific communication device using the specific communication-device address information and the specific communication attribute information received from the management device.

13. A conveyance system that conveys conveyance subjects, the conveyance system comprising:
a plurality of conveyance vehicles that convey conveyance subjects;
a plurality of transfer devices to and from which the conveyance subjects are transferred by the plurality of conveyance vehicles;
a plurality of communication devices each of which is connected to a corresponding one of the plurality of transfer devices; and
a management device that manages the plurality of communication devices; wherein
each of the plurality of conveyance vehicles includes:
a first storage that stores specific transfer location information indicating a transfer location of a conveyance subject in a specific transfer device among the plurality of transfer devices; and
a first communicator that transmits the specific transfer location information to the management device;
the management device includes:
a second storage that stores correspondence information indicating a correspondence between transfer location information indicating a transfer location of the conveyance subject for each one of the plurality of transfer devices and communication-device address information indicating an address of a corresponding one of the plurality of communication devices that is connected to the one of the plurality of transfer devices;
a controller that extracts, from the correspondence information, specific communication-device address information corresponding to the specific transfer location information received from a specific conveyance vehicle among the plurality of conveyance vehicles; and
a second communicator that transmits, to the specific conveyance vehicle, the specific communication-device address information extracted; and
the first communicator of the specific conveyance vehicle executes communication with a specific communication device among the plurality of communication devices that is connected to the specific transfer device, using the specific communication-device address information received from the management device, the communication being executed to transfer the conveyance subject between the specific transfer device and the specific conveyance vehicle.

14. A management device that manages a plurality of communication devices each of which is connected to a corresponding one of a plurality of transfer devices to and from which a conveyance subject is transferred by a conveyance vehicle, the management device comprising:
a storage that stores correspondence information indicating a correspondence between transfer location information indicating a transfer location of the conveyance subject for each one of the plurality of transfer devices and communication-device address information indicating an address of a corresponding one of the plurality of communication devices that is connected to the one of the plurality of transfer devices;
a communicator that receives, from the conveyance vehicle, specific transfer location information indicating a transfer location of the conveyance subject in a specific transfer device among the plurality of transfer devices; and
a controller that extracts, from the correspondence information, specific communication-device address information corresponding to the specific transfer location information received; wherein the communicator transmits, to the conveyance vehicle, the specific communication-device address information extracted.

* * * * *